(12) United States Patent
Muzzetto et al.

(10) Patent No.: US 11,842,783 B2
(45) Date of Patent: Dec. 12, 2023

(54) COUNTER-BASED SENSE AMPLIFIER METHOD FOR MEMORY CELLS

(71) Applicant: Micron Technology, Inc., Boise, ID (US)

(72) Inventors: Riccardo Muzzetto, Arcore (IT); Ferdinando Bedeschi, Biassono (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/976,690

(22) PCT Filed: Mar. 3, 2020

(86) PCT No.: PCT/IB2020/000082
§ 371 (c)(1),
(2) Date: Aug. 28, 2020

(87) PCT Pub. No.: WO2021/176244
PCT Pub. Date: Sep. 10, 2021

(65) Prior Publication Data
US 2023/0141713 A1 May 11, 2023

(51) Int. Cl.
*G11C 11/00* (2006.01)
*G11C 29/46* (2006.01)
(Continued)

(52) U.S. Cl.
CPC .......... *G11C 29/46* (2013.01); *G11C 29/1201* (2013.01); *G11C 29/42* (2013.01)

(58) Field of Classification Search
CPC ...... G11C 29/46; G11C 29/1201; G11C 29/42
See application file for complete search history.

(56) References Cited

U.S. PATENT DOCUMENTS 9,170,876 B1 10/2015 Bates et al.
10,075,190 B2 9/2018 Achtenberg et al.
(Continued)

FOREIGN PATENT DOCUMENTS

JP 2015-038794 A 2/2015
TW 202006544 A 2/2020
(Continued)

OTHER PUBLICATIONS

Taiwan Intellectual Property Office, "Office Action," issued in connection with ROC (Taiwan) Patent Application No. 110107314, dated Nov. 22, 2021 (3 pages).
(Continued)

*Primary Examiner* — Pho M Luu
(74) *Attorney, Agent, or Firm* — Holland & Hart LLP

(57) ABSTRACT

Methods, systems, and devices related to counter-based sense amplifier method for memory cells are described. The counter-based read algorithm may comprise the following phases:

storing in a counter associated to an array of memory cells the value of the number of bits having a predetermined logic value of the data bits stored in the memory array;

reading from said counter the value corresponding to the number of bits having the predetermined logic value;

reading the data stored in the array of memory cells by applying a ramp of biasing voltages;

counting the number of bits having the predetermined logic value during the data reading phase;

(Continued)

stopping the data reading phase when the number of bits having the predetermined logic value is equal to the value stored in said counter.

33 Claims, 15 Drawing Sheets

(51) Int. Cl.
    *G11C 29/12*     (2006.01)
    *G11C 29/42*     (2006.01)

(56) References Cited

U.S. PATENT DOCUMENTS

| | | |
|---|---|---|
| 10,956,260 B2 * | 3/2021 | Park .................. G06F 12/121 |
| 2011/0252289 A1 | 10/2011 | Patapoutian et al. |
| 2014/0269029 A1 * | 9/2014 | Kinney ............... G11C 11/1673 365/158 |
| 2015/0049538 A1 | 2/2015 | Okubo et al. |
| 2016/0179620 A1 | 6/2016 | Bazarsky et al. |
| 2017/0077957 A1 * | 3/2017 | Kang ................ H03M 13/2906 |
| 2019/0146873 A1 | 5/2019 | Wu et al. |
| 2019/0198099 A1 | 6/2019 | Mirichigni et al. |
| 2019/0294496 A1 | 9/2019 | Lien et al. |

FOREIGN PATENT DOCUMENTS

| | | |
|---|---|---|
| TW | 202006735 A | 2/2020 |
| WO | 2017/138235 A1 | 8/2017 |
| WO | 2019/126416 A2 | 6/2019 |

OTHER PUBLICATIONS

"ISA/KR, International Search Report and Written Opinion of the International Searching Authority, Int'l Appl. No. PCT/IB2020/000082, dated Nov. 25, 2020, Korean Intellectual Property Office, Seo-gu, Daejeon, Republic or Korea, 11pgs".

European Patent Office, "Search Report," issued in connection with Chinese Patent Application No. 20922767.7 dated Mar. 27, 2023 (10 pages).

Japan Patent Office, "Office Action," issued in connection with Japan Patent Application No. 2022-552697 dated Sep. 26, 2023 (15 pages) (8 pages of English Translation and 7 pages of Original Document).

Taiwan Patent Office, "Office Action," issued in connection with Taiwan Patent Application No. 111122144 dated Jul. 26, 2023 (9 pages).

\* cited by examiner

COUNTER-BASED SENSE AMPLIFIER METHOD FOR MEMORY CELLS

CROSS REFERENCE

The present Application for Patent is a 371 national phase of and claims priority to and the benefit of International Patent Application No. PCT/IB2020/000082 by Muzzetto, et al., entitled "COUNTER-BASED SENSE AMPLIFIER METHOD FOR MEMORY CELLS," filed Mar. 3, 2020, assigned to the assignee hereof, and expressly incorporated by reference herein.

BACKGROUND

The following relates generally to operating a memory array and more specifically to counter-based sense amplifier method for memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. A more robust read technique may be desired to increase memory cell performance and reliability when memory cells exhibit variable electrical characteristics, in particular memory devices having a three-dimensional (3D) array of memory cells.

DETAILED DESCRIPTION

Figure 1:
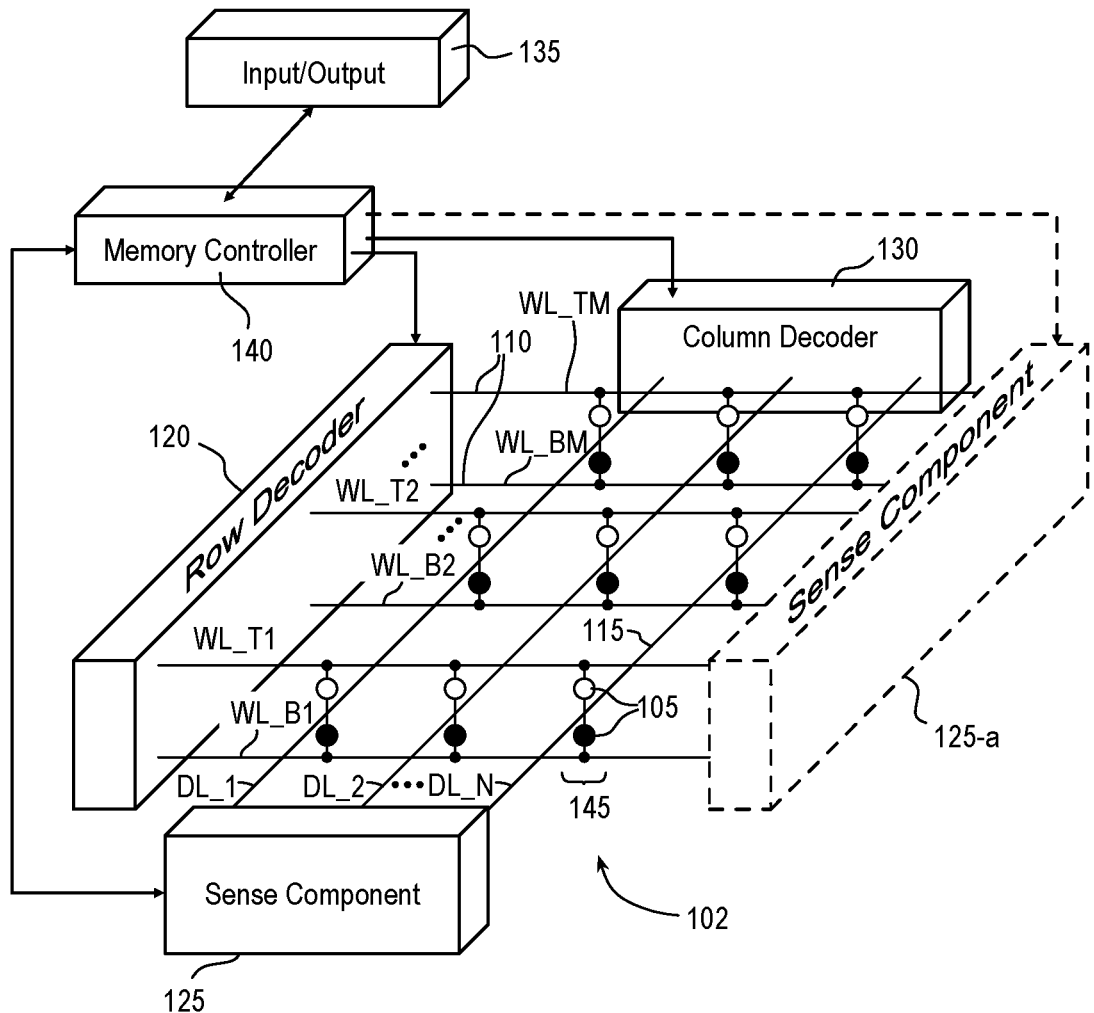
FIG. 1 illustrates an example of a memory device diagram having a three-dimensional (3D) array of memory cells that supports counter-based sense amplifier method for memory cells in accordance with embodiments of the present disclosure.

As it is known in this technical field, Phase change memories (PCM) use a class of materials that have the property of switching between two phases having distinct electrical characteristics, associated to two different crystallographic structures of the material, and precisely an amorphous, disorderly phase and a crystalline or polycrystalline, orderly phase. The two phases are hence associated to resistivities of considerably different values.

A phase-change material element exhibits different electric resistivity values depending on its phase, which can be associated to corresponding different logic states. The resistivity of the phase-change material in the amorphous phase is higher than the resistivity of the material in the crystalline phase. Different degrees of partial crystallization can also be possible, having intermediate resistivity values between the one of the (fully) amorphous phase and the one of the (fully) crystalline phase.

Ideally, all memory cells of a PCM memory device (hereinafter, briefly referred to as "PCM cell") should feature a same (nominal) resistivity (and therefore a same threshold voltage, the latter being the voltage to be applied to the memory cells for causing them to conduct a electric current) for a same logic state. However, since different PCM cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a PCM cell, a reading operation is carried out directed to assess to which threshold voltage distribution the threshold voltage of the PCM cell belongs. For example, a reading voltage (VDM) may be applied to the PCM cell and the logic state of the PCM cell is assessed based on (the presence or absence of) a current responsive to said reading voltage, the (presence or absence of the) current depending on the threshold voltage of the PCM cell.

Making reference to a binary PCM memory device, in which two threshold voltage distributions are provided (for example a first threshold voltage distribution corresponding to the SET state and a second threshold voltage distribution corresponding to the RESET state, wherein the threshold voltages of the first threshold voltage distribution are lower than the threshold voltages of the second threshold voltage distribution), the value of the reading voltage VDM is advantageously selected to be higher than the higher threshold voltage of the first threshold voltage distribution and lower than the lower threshold voltage of the second threshold voltage distribution.

PCM memory devices are negatively affected by a drawback caused by the change (in jargon, "drift") experienced by the resistivity of a PCM cell as time passes after its last programming. Indeed, once a PCM cell has been programmed to a logic state, corresponding to a resistivity value, the resistivity of the cell tends to increase with the passage of time, in a way that depends on several factors, such as the operating temperature of the PCM memory device (the higher the temperature, the faster is the resistivity increase with time), and the resistivity corresponding to the programmed logic state (PCM cells programmed to higher resistivity values experience a faster resistivity time drift compared to PCM cells programmed to lower resistivity values). The resistivity time drift causes in turn a drift of the threshold voltage distributions, which correspondingly move as time passes since the last program operation.

If the drift of the threshold voltage distributions is particularly high because the PCM memory device has not been subjected to program operations for a long time, the value of the reading voltage previously selected for carrying out reading operations could no longer be capable of assessing which threshold voltage distribution the threshold voltage of the PCM cell belongs to.

Drift and cycling are window budget detractor pushing out the VDM and degrading the technology memory capability.

A solution has been suggested (for instance in U.S. Pat. No. 8,553,453) to read PCM memory cells with a ramp generator and to measure the timers per page generating a time event to enable the read of page bits based on the voltage ramp. A switch detector is used to stop the ramp raising. This solution is relatively cheap but not deterministic and is based on the assumption that the cell distribution has a known shape (i.e. gaussian); moreover, it is affected by circuit noise depending on the implementation.

A further solution has been suggested (for instance in U.S. Pat. No. 8,913,426) to measure a known pattern status as a reference generating a digital voltage ramp further appending soft-information to the ramp. This solution requires the use of look-up tables and an ECC overflow with soft corrections.

Differently from the known solution, the method disclosed in the present specification starts from the consideration that the ECC feedback information sometimes is not sufficient for a correct reading of the memory cells content. This happens for instance in case of errors due to a cell read as a "0" or viceversa.

For instance, in case of a memory word storing a balanced pattern including a number of logic values "1" corresponding to the logic values "0", then it would be necessary to read at least N/2 cells. However, if a cell storing a "0" is not programmed well, then that cell will be read as "1" and the reading phase would return N/2 cells read as "1" in which however there is one wrong cell that should have stored a "0". At the same time the reading would return N/2 cells read as "0" in which there is one cell storing a "1". Therefore, if a cell is broken, it will produce two errors. For this reason, the ECC1 is not sufficient to repair such an error. The same situation would apply with ECC2 that will not repair two errors because two broken cells produces four errors, and so on.

In view of the above example it should be clear that the feedback from the ECC alone is not enough but the method of the present disclosure teaches to follow a more sophisticated reading algorithm that requires a feedback from ECC during the reading of a number of cells corresponding to N("1") minus N(ECC). Such an algorithm will produce the minimum number of feedback request from ECC with the lowest reading time.

The method of the present disclosure uses a codeword portion, hereinafter also referred to as a counter, with bits protected with ECC, or with other mechanism like two cells per bit voting scheme; this method requires just a modification in the programming mechanism that stored the content of the counter during the storing of a memory codeword. The codeword could include information: like the topology, ECC, to be used during the reading phase.

The reading phase of the counter content, e.g., of the bits in the codeword counter portion, is activated during the leakage balance phase of the memory cells while the reading algorithm is activated during the regular read phase of the memory cells.

The present disclosure relates to a new and more efficient solution based on a counter-based sense amplifier method for reading memory cells in 3D memory devices. This solution allows reducing the voltage applied to the memory cells during the reading phase thus reducing the stress applied to the memory cells and further reducing the power necessary to generate the biasing voltages.

This new proposed technique is based substantially in two steps, the first one done at the programming phase and the second one done at the sensing phase.

In the programming phase it is suggested the use of a Bit Flip (BF) to set the pattern of a memory codeword to mostly (>50%) logic values zero (with high Vth) or logic values one (with low Vth). In other words, a counter is used to detect the value of the number of cells that have been programmed in a certain codeword with a logic value "0" or "1".

More particularly, using a Bit Flip that is capable to invert the cell programming it is possible to focus the counting activity on a logic value or the other. Just as an example, during the pre-charge phase, when a programming phase is started, the Bit Flip is used for obtaining that at least 50% of the cells be programmed with a logic value "1".

Said differently, if the distribution of the programmed cells is indicative of 30% of the cells programmed at a logic value "0", then using the Bit Flip is possible obtaining an indication that there is a percentage of 70% of memory cells programmed at the opposite logic value "1".

This solution is particularly suitable in presence of word line drops (i.e. IR drops) and allows faster programming and less energy/bit.

It should however be noted that this first passage through the Bit Flip encoder is optional and may be chosen according to the physical implementation and if it is preferable for cell reliability.

At this point, it is possible from the written and stored data, after the possible BF manipulation, to count the number of programmed logic values "1" and reliably write this value in a counter memory portion including ECC bit(s), e.g., storing the value with protected double cells (data/data #). So, the technique disclosed herewith suggests storing in a reliable counter with associated ECC bit(s) the value corresponding to the number of cells programmed at a certain logic value, for instance the logic value "1".

As an alternative, using the BF manipulation it would be possible to use a balanced 50-50%+balanced ECC coding, if the codeword should include a perfect even number of programmed logic values "1" and "0". In such a case, counter cells would not be strictly necessary and no download would be required (WIP), but this alternative would generally require a larger initial BF manipulation.

At this point all the bits of the codeword (regardless their initial state) are written thus obtaining an iso-usage codeword.

During the subsequent sensing phase, it has been decided to first read the content of the counter applying a fast ramp of biasing voltage and downloading the counter cells while doing other operations on the main codeword (e.g. compensating the leakage). This reading phase allows obtaining first the information stored in the counter.

The other data cells are biased accordingly and concurrently with the reading operations on the counter; so, the data bits of the memory array are biased during the voltage ramp on the counter. Moreover, the application of different very fast ramps is possible due to differential counters structure.

Now, starting the main ramp up on the data memory cells and accurately counting up to the target number of the cells programmed with low Vth (i.e. to the logic value "1") written in the counter then stop the reading phase.

Anytime a cell is triggered, then it is turned it automatically off to reduce the IR drops while at the same time it is decremented the counter including the value corresponding to the number of cells having said logic value.

Therefore, in order to summarize the deterministic counter-based sense amplifier method of the present disclosure we may say that it comprises the following steps or phases:
storing in a counter associated to an array of memory cells the value of the number of bits having a predetermined logic value of the data bits stored in said array;
reading from said counter the content, or value, corresponding to the number of bits having said predetermined logic value;
reading the data stored in the array of memory cells by applying a ramp of biasing voltages;
counting the number of bits having said predetermined logic value during the data reading phase;
stopping the data reading phase when the number of bits having said predetermined logic value is equal to the value stored in said counter (e.g., its content).

The storing phase in the counter includes first the use of a Bit Flip phase to switch the number of bits having a predetermined logic value to obtain a value greater than or equal to 50% of the data bits having that logic value.

Moreover, the counter reading phase, that sometime may be a first reading phase, is performed with a fast biasing voltage ramp on said counter while starting the pre-charge or line leakage compensation phase of the data bits portion of the array of memory cells.

The present disclosure further relates to a memory device including at least one or more arrays of memory cells and a memory controller supporting a counter-based sense amplifier method for reading the memory cells, comprising:
a set of Bit Flip cells for every codeword of a memory array to encode manipulated stored data up to a desired number of bits in a logic value.

The Bit Flip cells are protected by a 3D cross point cells voting scheme or by differential 3D cross point cells with ECC bit(s),), e.g., storing the bit-flip value with protected double cells (BF/BF #). .

Moreover, the memory device further comprises a counter for each codeword wherein recording a number corresponding to the bits of the codeword having the same logic value.

The features and advantages of the counter-based sense amplifier method of the present disclosure will be discussed in detail in the following paragraphs; however, for a better understanding of the whole disclosure it is appropriate describing first the physical structure of the memory device to which the reading technique is applied. This will be first done with reference to the FIGS. 1 and 2.

As it is known, in some cases memory cells exhibit non-uniform, variable electrical characteristics that may originate from various factors including statistical process variations, cycling events (e.g., read or write operations on the memory cells), or a drift (e.g., a change in resistance of a chalcogenide alloy), among others. Just because of the drift it would be necessary to increase the voltage value of the biasing voltages used during the reading phase. Well, the technique adopted in the present disclosure allows reducing the VDM value and, as a consequence, improves the read disturb immunity.

The counter-based sense amplifier method for memory cells of the present disclosure may provide a reliable and robust read technique in which reading a set of user data (e.g., a codeword, a page) is carried out by tracking a number of memory cells activated in response to a read voltage applied to the memory cells. In some instances, the counter-based read algorithm may use a predetermined number to decide whether the memory cells associated with a first logic state have been accounted for while reading the user data. Further, the counter-based read algorithm may determine a total number of memory cells associated with the first logic state while reading the user data.

In some aspects, the counter-based read algorithm techniques reduces or eliminates a separate set of read-reference memory cells that may be present in a memory device. The read-reference memory cells may not possess common electrical characteristics with a majority of memory cells in which user data are stored due to various reasons, such as different process conditions (e.g., a non-uniform loading pattern of a plasma density) during fabrication process steps, a different cycling events, among others. Hence, the separate set of read-reference memory cells may not provide a reliable referencing scheme during a read operation.

The counter-based read algorithm techniques of the present disclosure may include an encoding scheme to apply to user data to establish a predetermined number of bits in encoded user data to have a given logic state (e.g., a logic state of 1) prior to storing the encoded user data in memory cells. The encoding scheme may include adding a number of extra bits (which may also be referred to as parity bits) to the user data during the encoding process. In some embodiments, the counter-based read algorithm may use a different encoding scheme that stores a counting information corresponding to a total number of bits in the user data having a given logic state (e.g., a logic state of 1) in a number of memory cells when storing the user data. In some cases, the counting information may be stored as a binary number that represent the total number of bits in the user data having the given logic state. In other cases, the counting information may be encoded to have a weight pattern of a given weight (e.g., 20%, 30%, 50% (i.e., one-half of the memory cells storing the counting information have the given logic state), 75%).

In some aspects, a memory device may include an array of PCM cells arranged in a 3D architecture, such as 3D XPoint™ memory to store user data. PCM cells in 3D XPoint™ architecture (which may also be referred to as 3DXP memory cells) may represent a first logic state (e.g., a logic state of 1) associated with a first set of threshold voltages or a second logic state (e.g., a logic state of 0) associated with a second set of threshold voltages. In some embodiments, a logic state of 1 (e.g., a SET state of a PCM cell, which may also be referred to as a SET cell or bit) corresponds to a set of threshold voltages lower than a set of threshold voltages associated with a logic state of 0 (e.g., a RESET state of a PCM cell, which may also be referred to as a RESET cell or bit).

The counter-based read algorithm techniques may include application of a voltage (e.g., a read voltage) to a memory array that is configured to activate a group of memory cells containing encoded user data. The voltage may increase as a function of time with a constant rate of change. In some cases, the read voltage has a monotonically increasing staircase shape such that a first voltage is applied for a first period of time followed by a second different voltage for a second period of time. The applied read voltage may initiate a series of switching events by activating the group of memory cells storing the encoded user data. The switching event may be attributed to a memory cell turning on (e.g., conducting an appreciable amount of current) when the applied voltage across the memory cell exceeds its threshold voltage. The counter-based read algorithm techniques may track a number of memory cells turning on (e.g., activating) in response to the read voltage.

When the user data have been encoded with a predetermined number of memory cells to have a first logic state (e.g., a logic state of 1), the counter-based read algorithm techniques may compare the number of activated memory cells with the predetermined number stored in a memory device. When the number of activated memory cells is less than the predetermined number, the counter-based read algorithm techniques may continue to apply (e.g., increase) the read voltage to the memory array while tracking additional memory cells that are activated (e.g., until the number of activated memory cells matches the predetermined number). When the number of activated memory cells matches the predetermined number, the counter-based read algorithm may stop applying the read voltage to the memory array and make a determination that all the activated memory cells of the encoded user data has the first logic state. Further, the counter-based read algorithm may determine that remaining memory cells of the encoded user data (e.g., the inactive memory cells when the number of activated memory cells matches the predetermined number) have a second logic state (e.g., a logic state of 0).

When the user data have been encoded with an additional set of memory cells that stores counting information corresponding to a total number of bits in the user data having a first logic state (e.g., a logic state of 1), the counter-based read algorithm techniques may read the counting information from the additional set of memory cells to identify the total number. The total number may be stored in a memory device to provide a criterion as to whether a read voltage may continue or stop while tracking a number of activated memory cells of the user data in response to the read voltage. When the number of activated memory cells is less than the total number, the counter-based read algorithm techniques may continue to apply (e.g., increase) the read voltage to the memory array while tracking additional memory cells that are activated until the number of activated memory cells matches the total number. When the number of activated memory cells of the user data matches the total number, the counter-based read algorithm techniques may stop applying the read voltage to the memory array and determine that all the activated memory cells of the user data has the first logic state (e.g., the SET state of a PCM cell). Additionally, the counter-based read algorithm techniques may determine that remaining memory cells of the user data (e.g., the inactive memory cells when the number of activated memory cells matches the predetermined number) have a second logic state (e.g., the RESET state of a PCM cell).

In some cases, the counting information is encoded to have a fixed number of bits of a first logic state (e.g., a logic state of 1) prior to being stored in the additional set of memory cells. As an example, one-half of the additional set of memory cells may be configured to have the logic state of 1 to represent the count information. During a read operation, the counter-based read algorithm may track a number of activated memory cells of the additional set of memory cells to determine if all the memory cells of the additional set of memory cells having the logic state of 1 are accounted for. When all the memory cells of the additional set of memory cells has been accounted for (e.g., activated), the counter-based read algorithm techniques may set a flag in a memory device and extract the counting information from the additional set of memory cells. The counting information may be stored in a register in the memory device and the flag may indicate that the counting information in the register is a valid representation (e.g., in binary format) of a total number of bits in the user data exhibiting a first logic state (e.g., a logic state of 1). The counting information in the register may then be used to track a number of memory cells activated in the user data in a similar manner described above. In some embodiments, a different read voltage may be applied to the additional set of memory cells compared to the memory cells storing the user data. Additionally or alternatively, a single read voltage may be applied to both the additional set of memory cells and the memory cells storing the user data.

Features of the disclosure introduced above are further described below in the context of a memory array in a memory device. Specific non-limiting examples are then described for illustrating various features of the counter-based sense amplifier method for memory cells in accordance with some embodiments (e.g., the memory array including PCM cells or 3DXP memory cells). These and other features of the disclosure are further illustrated by and described with reference to apparatus diagrams, system diagrams, and flowcharts that relate to counter-based sense amplifier method for memory cells. As a person of ordinary skill in the art would appreciate, however, other alternatives and different variations may be considered and fall within the scope of this disclosure.

FIG. 1 illustrates an example memory device 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a PCM cell (e.g., a 3DXP memory cell). Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the 3D memory array 102 includes two levels of memory cells 105; however, the number of levels may not be limited to two. Each level may be aligned or positioned such that memory cells 105 may be aligned (exactly, overlapping, or approximately) with one another across each level, forming a memory cell stack 145. In some cases, the memory cell stack 145 may include a PCM cell (e.g., 3DXP memory cell) laid on top of another.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

Figure 2:
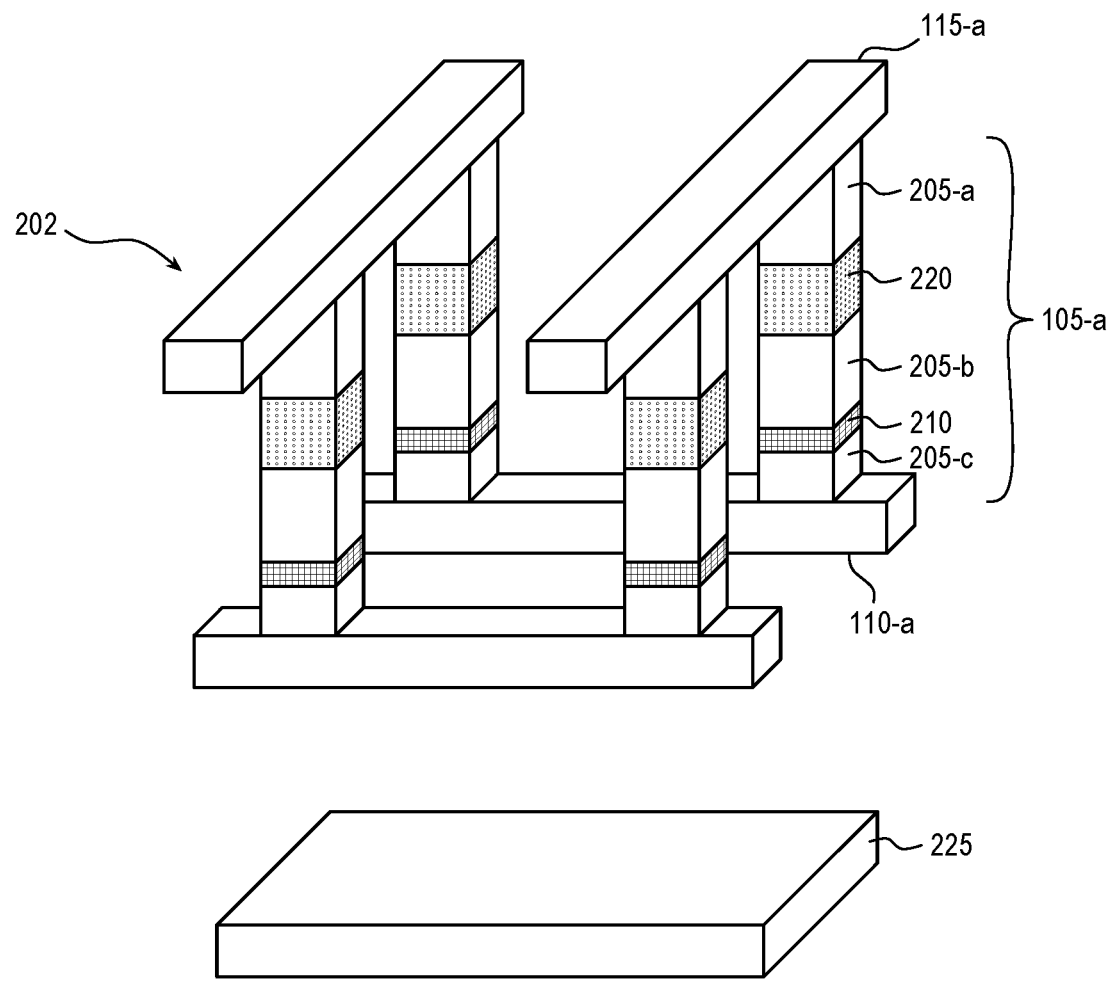
FIG. 2 illustrates an example of a 3D memory array that supports counter-based sense amplifier method for memory cells in accordance with embodiments of the present disclosure.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different. In other embodiments, the memory cell 105 may include an additional electrode to separate the chalcogenide alloy into two parts as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting access line 110 and digit line 115. In some embodiments, access lines 110 may also be known as word lines 110, and bit lines 115 may also be known as digit lines 115. References to word lines and bit lines, or their analogues, are interchangeable without loss of understanding or operation. Energizing or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor) may be electrically isolated from the digit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding digit line 115. The digit line 115 may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3DXP memory cell or a self-selecting memory (SSM) cell, both having two terminals and may not need a separate selection component. As such, one terminal of the 3DXP memory cell or the SSM cell may be electrically connected to a word line 110 and the other terminal of the 3DXP memory cell or the SSM cell may be electrically connected to a digit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate digit line 115. For example, the 3D memory array 102 may include multiple word lines 110, labeled WL_B1 (or WL_T1) through WL_BM (or WL_TM), and multiple digit lines 115, labeled DL_1 through DL N, where M and N depend on the array size. Thus, by energizing a word line 110 and a digit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

A memory cell 105 may be set or written by similarly energizing the relevant word line 110 and digit line 115 and at least one logic value may be stored in the memory cell 105. Column decoder 130 or row decoder 120 may accept data, for example input/output 135, to be written to one or more memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, energizing a single word line 110 may result in the discharge of all memory cells 105 in the row; thus, several or all memory cells 105 in the row may need to be re-written. But in non-volatile memory, such as SSM, PCM (e.g., 3DXP memory), FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to energize the desired word line 110 and digit line 115. Memory controller 140 may also generate and control various voltages or currents used during the operation of memory device 100.

The memory controller 140 may receive user data through the input/output 135. In some embodiments, the memory controller 140 encodes the user data to satisfy a condition prior to storing the user data in memory cells 105. The condition may be satisfied when encoded user data have a predetermined number of bits exhibiting a given logic state (e.g., a logic state of 1). As a way of example, the encoded user data may be configured to have 50% of the memory cells storing the encoded user data to exhibit the logic state of 1 while the other 50% of the memory cells to exhibit a logic state of 0. During the encoding process, the memory controller 140 may add a certain number of bits (e.g., parity bits) to the user data to establish the predetermined number of memory cells to exhibit the given logic state. As a result of adding the parity bits, the encoded user data may have more bits than the user data. The memory controller 140 may store the predetermined number in a register. In some embodiments, a different percentage value (e.g., 40%, 60%, 75%) of the memory cells exhibiting the logic state of 1 may be employed during the encoding process.

The memory controller 140 may apply a read voltage to the memory array 102 to activate a group of memory cells 105 containing the encoded user data with the predetermined number of bits exhibiting the given logic state. The read voltage may have a constant rate of increase or monotonically increasing staircase shape. The applied read voltage may activate a subset of the memory cells 105 containing the encoded user data as a result of applying the read voltage when the applied read voltage across the memory cells 105 exceeds their threshold voltages. The memory controller 140 may track the number of activated memory cells 105 and compare the number to the predetermined number stored in the register. When the number of activated memory cells 105 matches the predetermined number, the memory controller 140 may determine that all the memory cells exhibiting the given logic states are accounted for out of the group of memory cells containing the encoded user data and stop applying to read voltage. Subsequently, the memory controller 140 may determine that all the activated memory cells 105 has the given logic state.

In general, the amplitude, shape, polarity, and/or duration of an applied voltage or current discussed herein may be adjusted or varied and may be different for the various operations discussed in operating the memory device 100.

Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 202 that supports counter-based sense amplifier method for memory cells in accordance with embodiments of the present disclosure. Memory array 202 may be an example of portions of memory array 102 described with reference to FIG. 1. As depicted in FIG. 2, memory array 202 includes multiple materials to construct a memory cell 105-a. Each memory cell 105-a is stacked in a vertical direction (e.g., perpendicular to a substrate) to create memory cell stacks (e.g., the memory cell stack 145). The memory cell 105-a may be an example of a memory cell 105 described with reference to FIG. 1. Memory array 202 may thus be referred to as a 3D memory array. The architecture of memory array 202 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

Memory array 202 also includes word lines 110-a and bit lines 115-a, which may be examples of word line 110 and bit line 115 described with reference to FIG. 1. Illustration of the materials between the word lines 110-a and the bit lines 115-a depicted in FIG. 2 may represent a lower portion of the memory cell 105 in FIG. 1. Memory array 202 includes electrodes 205, logic storage elements 210, selector device elements 220, and a substrate 225. In some examples, a single component including a chalcogenide alloy (not shown, replacing selector device element 220, logic storage element 210, and electrode 205-b) may act as both a logic storage element and a selector device. Electrode 205-a may be in electronic communication with bit line 115-a and electrode 205-c may be in electronic communication with word line 110-a.

Insulating materials depicted as empty spaces may be both electrically and thermally insulating. As described above, in PCM technology, various logic states may be stored by varying the electrical resistance of the logic storage element 210 in memory cells 105-a, which in turn exhibiting varying threshold voltages of the memory cells 105-a. In some cases, storing various logic states includes passing a current through the memory cell 105-a, heating the logic storage element 210 in memory cell 105-a, or melting (e.g., wholly or partially) the material of the logic storage element 210 in memory cell 105-a. Other storage mechanisms, such as threshold voltage modulation, may be exploited in chalcogenide-based memories.

In some cases, memory array 202 may include an array of memory cell stacks, and each memory cell stack may include multiple memory cells 105-a. Memory array 202 may be made by forming a stack of conductive materials, such as word lines 110-a, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-a and bit lines 115-a such that each memory cell 105-a may be coupled with a word line 110-a and a bit line 115-a.

The selector device element 220 may be connected with the logic storage element 210 through electrode 205-b. In some examples, the positioning of the selector device element 220 and the logic storage element 210 may be flipped. The composite stack including the selector device element 220, the electrode 205-b, and the logic storage element 210 may be connected to a word line 110-a through the electrode 205-c and to a bit line 115-a through the electrode 205-a. The selector device element 220 may aid in selecting a particular memory cell 105-a or may help prevent stray currents from flowing through non-selected memory cells 105-a adjacent to a selected memory cell 105-a. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-a of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-a may be heated by passing a current through the memory cell 105-a. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-a may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

In some cases, memory cells 105-a may exhibit different electrical characteristics after a number of cycling operations (e.g., a series of read or write operations). For example, a threshold voltage of a memory cell 105-a (e.g., PCM cell) corresponding to a logic state of 1, after receiving an identical programming pulse to store the logic state of 1 (e.g., a SET programming pulse), may be different if a memory cell 105-a is relatively new (e.g., a PCM cell with a small number of read or write operations) compared to a memory cell 105-a having been cycled through an extensive number of read or write operations. In addition, in some cases, a chalcogenide material in the memory cells 105-a (e.g., the logic storage element 210) may experience a change (which may also be referred to as a drift) in its resistance after programming (e.g., crystallizing or quenching) of the chalcogenide material during a write operation. Such change in resistance may result in changes in threshold voltages of memory cells 105-a and may hinder accurately reading information from memory cells 105-a (e.g., PCM cells) after a certain period of time elapsed. In some embodiments, the amount of change may be a function of an ambient temperature.

The counter-based read algorithm techniques may provide a robust read technique when memory cells 105-a (e.g., PCM cells) exhibit different electrical characteristics described above. In some embodiments, the memory cells 105-a may be configured to store encoded user data that include modified user data (or original user data, in some cases) and a number of parity bits, which may be added thereto. In some cases, the encoded user data stored in the memory cells 105-a have been modified to include a predetermined number of bits having the logic state of 1. The number of bits having the logic state of 1 may be different depending on encoding scheme employed. In some cases, the number of bits having the logic state of 1 may be 50% (or other percentage) of the bits containing the encoded user data. In some embodiments, the memory cells 105-a may be configured to store user data while an additional set of memory cells 105-a is configured to store a counting information. The counting information may represent a number of bits in the user data having the logic state of 1. In some cases, the counting information may be read in advance to extract the number of bits in the user data having the logic state of 1 before the user data are read. Additionally or alternatively, the counting information may be determined while the user data are being read. The counter-based read algorithm techniques utilize encoding schemes that provide a precise number of memory cells 105-a having the logic state of 1, which may in turn enable the counter-based read algorithm techniques to read user data accurately regardless of the different electrical characteristics of memory cells described above.

Figure 3:
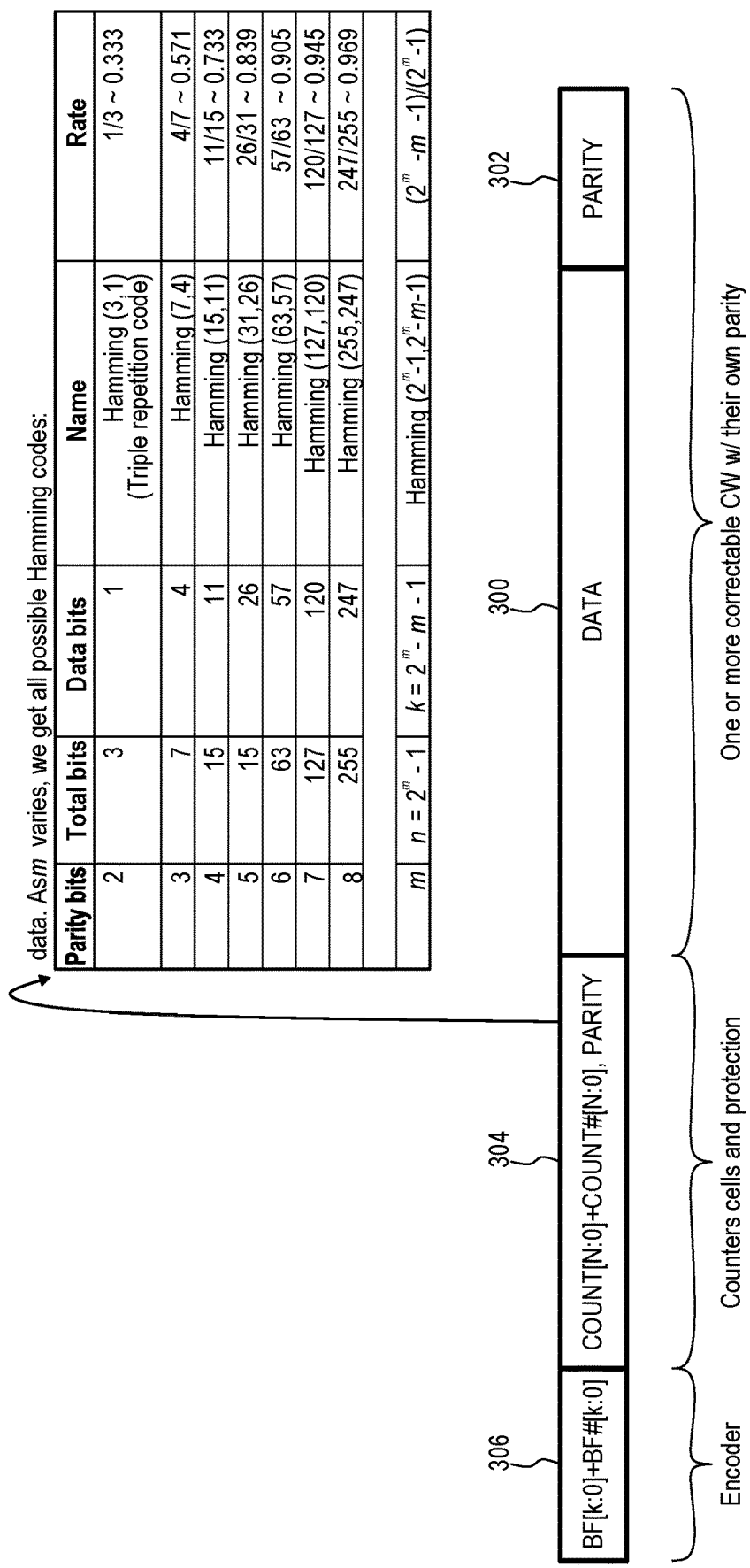
FIG. 3 illustrates an example of a memory page including a codeword composition supporting the counter-based sense amplifier method for reading memory cells in accordance with embodiments of the present disclosure.

Let's now make reference to the example of FIG. 3 wherein it is shown a schematic view of a memory page corresponding to an extended codework composition.

FIG. 3 illustrates an example of a conventional memory page including a data portion 300 including one or more codewords CW of data bits with their own parity bits 302.

We may consider that the combination of the data portion 300 and the parity bits 302 form the whole correctable codeword that in this example is taken as a sixteen bits codeword.

The other portions of the memory page are group 304 of counter cells with relating parity protection and a Bit Flip (BF) encoder 306. This Bit Flip may include K bits and is appended to the codeword.

If the codeword includes a data portion 300 relatively small, then the counter bits have an impact proportionally high. However, with larger data bits the corresponding counter has a minor impact.

Now, let's suppose just as a specific example that the codeword CW (after correction, merging with new data and parity generation) is formed by the following sequence of logic values:

0010011101001000

This sequence is stored into the a BankReadWriteBuffer (BRWBuff).

The corresponding BF encoder 306 is given for instance by BF=0 thus obtaining a combined two bits differential value (0,1). The BF encoder can be read as double cells or as a voting scheme superimposed to double cells.

The target counter is given by six logic values, i.e. 6×d, that is implemented by the sequence 110×b with their inverted values 001 giving the following result:

(1,0) (1,0) (0,1)

Therefore, the piece of information that is written into the whole array shown in FIG. 3 is composed by:
BF+COUNTERS+CODEWORD
01+101001+0010011101001000

The sensing phase may start counting all the logic values "1" and compare them with the value given by the six bits contained in the counter portion 304 6×d. Then the reading phase may be stopped if there are no cell errors.

Well, the above disclosed memory array including the codeword may be further improved and modified according to the present disclosure adding additional information to the codeword, for instance information about the topology, previous pulses information, write status, etc.

Figure 4:
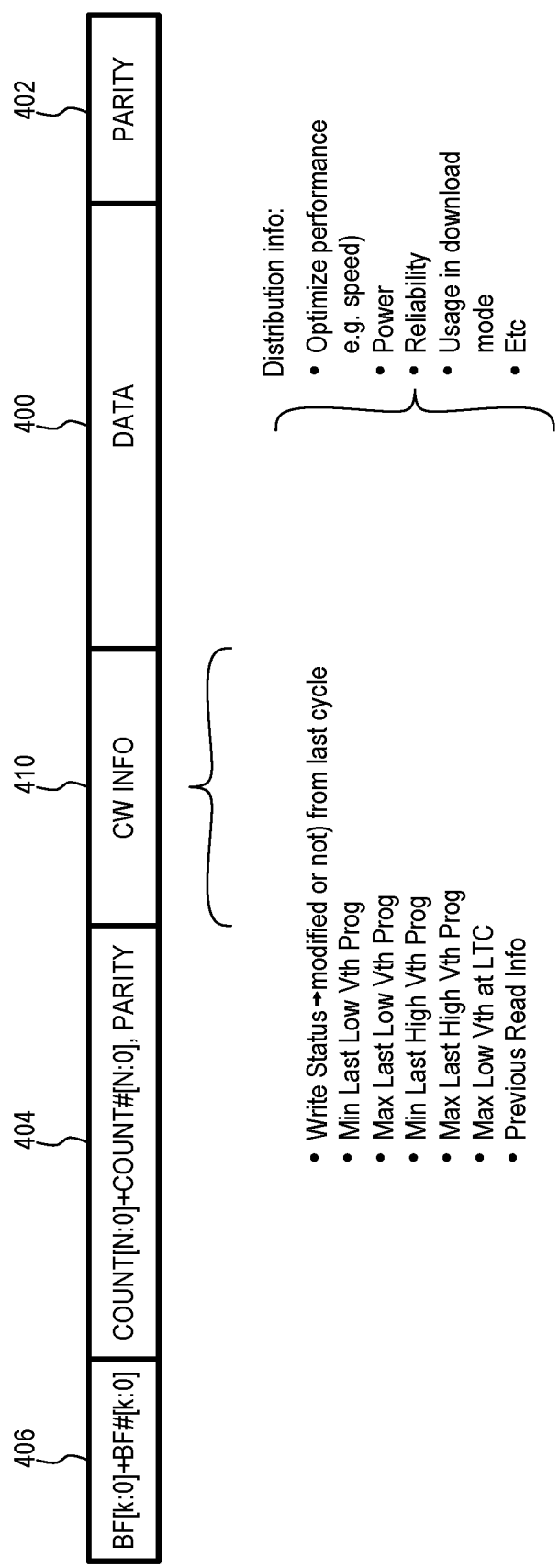
FIG. 4 illustrates a further example of an improved memory page including an extended codeword composition supporting the counter-based sense amplifier method for reading memory cells in accordance with embodiments of the present disclosure.

For instance, making reference to the example of FIG. 4 it may be appreciated the presence of a further group of bits including these additional CW information. It should be further noted that the memory page shown in FIG. 4 represents a single patch that is to say a structure including the largest number of bits that may be read in parallel with a single reading action of the sense amplifiers.

Reducing the number of single structures that may be read with a single reading action is very important to reduce the power involved during the biasing phase.

FIG. 4 illustrates an example of an improved memory page including a data portion 400 including one or more codewords CW with their own parity bit 402 and an additional group of cells 410 dedicated to extra codeword information.

The codeword information contained in the memory portion 410 may be following: the write status modified or not by the last cycle; the minimum value of the last low programming voltage Vth; the maximum value of the last low programming voltage Vth; the minimum value of the last high programming voltage Vth; the maximum value of the last high programming voltage Vth; the previous reading information, etc.

The above list of possible codeword information are not intended to be exhaustive but should be considered as voltage distribution information intended to optimize the performances (i.e. the reading speed) or the supplied power or the reliability or the usage in download mode, etc.

The counter-based sense amplifier method or method for the memory cells of the present disclosure requires the use of a counter during the reading phase but the counting algorithm may operate in parallel with signal development.

Moreover, the counter may be protected with ECC (for instance dedicating four bits to protect up to eleven bits). In particular, the detective power should be greater then the corrective power.

The counter may be differential, double differential (Fat cells) etc.

No voltage reference Vref is required for the counter reading phase since a biasing voltage ramp is used and the reading is stopped once the counted value has been determined avoiding stressing the counter cells.

Moreover, if the codeword is balanced (i.e. 50-50%) we do not even need to store the count, but just to encode since we must expect N/2 logic values set to "1" or to "0". This second approach will be disclosed later.

However, in the following paragraph of the present disclosure we will appreciate that the use of the counter does not represent a burden in terms of access time since the counter reading phase may be performed in parallel during the pre-charge phase while sensing the regular data cells.

Figure 4A:
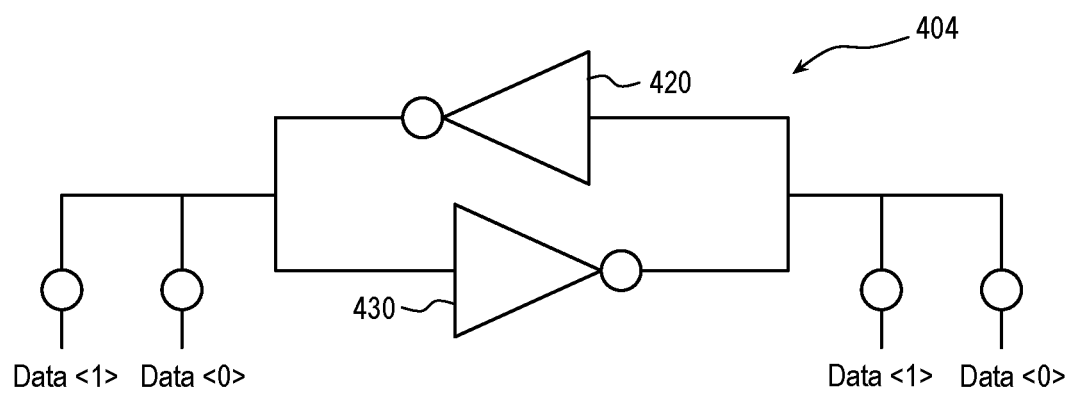
FIG. 4A is a schematic view of the structure of a counter register associated to the memory page of FIG. 3.

FIG. 4A illustrates an example of the structure of a counter register associated to the memory codeword of the present disclosure. The counter 404 corresponds to the schematic block 404 of FIG. 4 and includes a first 420 and a second inverter 430 interconnected between two differential data cells implemented according to the 3DXP technology, that is to say: Data<1> and Data<0> and the inverted cells Data #<1> and Data #<0>.

Figure 5:
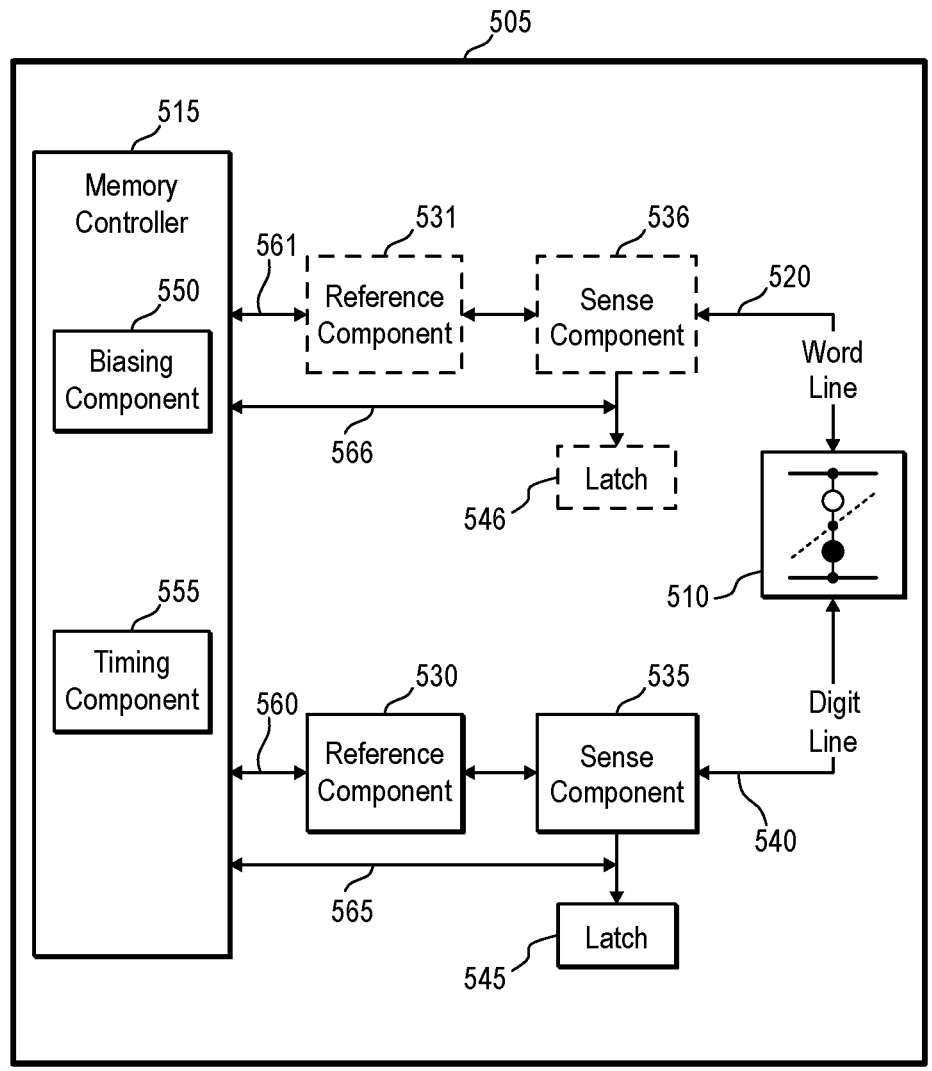
FIG. 5 shows a block diagram of a device that supports the counter-based sense amplifier method for reading memory cells in accordance with embodiments of the present disclosure.

Let's now consider the example of FIG. 5 wherein it is illustrated an example of a memory device supporting the method of the present disclosure.

More specifically, FIG. 5 shows a block diagram 500 of a memory array 505 that supports counter-based sense amplifier method for reading memory cells in accordance with embodiments of the present disclosure. The memory array 505 may be referred to as an electronic memory apparatus and may be an example of a component of a memory device as described herein.

The memory array 505 may include one or more memory cells 510, a memory controller 515, a word line 520, a reference component 530, a sense component 535, a digit line 540, and a latch 545. These components may be in electronic communication with each other and may perform one or more of the functions described herein. In some cases, the memory cells 510 may include 3DXP memory cells. In some aspects, the memory controller 515 may include a biasing component 550 and a timing component 555. In some embodiments, a sense component 535 may serve as the reference component 530. In other cases, the reference component 530 may be optional.

The memory controller 515 may be in electronic communication with the word line 520, the digit line 540, and the sense component 535, which may be examples of the word line 110, the digit line 115, and the sense component 125 described with reference to FIGS. 1 and 2. The components of the memory array 505 may be in electronic communication with each other and may perform aspects of the functions described with reference to FIGS. 3 and 4. In some cases, the reference component 530, the sense component 535, and the latch 545 may be components of the memory controller 515.

In some embodiments, the digit line 540 is in electronic communication with the sense component 535 and a memory cell 510. The memory cell 510 may be writable with a logic state (e.g., a first, second, or third logic state). The word line 520 may be in electronic communication with the memory controller 515 and the memory cell 510. The sense component 535 may be in electronic communication with the memory controller 515, the digit line 540, the latch 545, and the reference line 560. The reference component 530 may be in electronic communication with the memory controller 515 and the reference line 560. A sense control line 565 may be in electronic communication with the sense component 535 and the memory controller 515. These components may also be in electronic communication with other components, both inside and outside of the memory array 505, in addition to components not listed above, via other components, connections, or buses.

The memory controller 515 may be configured to energize the word line 520 or the digit line 540 by applying voltages to those various nodes. For example, the biasing component 550 may be configured to apply a voltage to operate the memory cell 510 to read or write the memory cell 510 as described above. In some cases, the memory controller 515 may include a row decoder, a column decoder, or both, as described herein. This may enable the memory controller 515 to access one or more memory cells 105 as illustrated with reference to FIG. 1. The biasing component 550 may also provide voltage to the reference component 530 in order to generate a reference signal for the sense component 535. Additionally, the biasing component 550 may provide voltages for the operation of the sense component 535.

In some embodiments, the memory controller 515 may perform its operations using the timing component 555. For example, the timing component 555 may control the timing of the various word line selections or bit line biasing, including timing for switching and voltage application to perform the memory functions, such as reading and writing, discussed herein. In some cases, the timing component 555 may control the operations of the biasing component 550.

The reference component 530 may include various components to generate a reference signal for the sense component 535. The reference component 530 may include circuitry configured to produce a reference signal. In some cases, the reference component 530 may be implemented using other 3DXP memory cells. The sense component 535 may compare a signal from the memory cell 510 (through the digit line 540) with a reference signal from the reference component 530. Upon determining the logic state, the sense component may then store the output in the latch 545, where it may be used in accordance with the operations of an electronic device that the memory array 505 is a part. The sense component 535 may include a sense amplifier in electronic communication with the latch 545 and the memory cell 510.

The memory controller 515 and/or at least some of its various sub-components may be implemented in hardware, software executed by a processor, firmware, or any combination thereof. If implemented in software executed by a processor, the functions of the memory controller 515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 515 and/or at least some of its various sub-components may be physically located at various positions, including being distributed such that portions of functions are implemented at different physical locations by one or more physical devices. In some embodiments, the memory controller 515 and/or at least some of its various sub-components may be a separate and distinct component in accordance with various embodiments of the present disclosure. In other examples, the memory controller 515 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

The memory controller 515 may apply a voltage (e.g., a read voltage) to a memory array configured to activate a group of memory cells containing encoded user data during a read operation. The voltage may increase as a function of time with a constant rate of change. The memory controller 515 may track a number of memory cells turning on (e.g., activating) in response to the read voltage. In some embodiments, the memory controller 515 may compare the number of activated memory cells with a predetermined number stored in a memory device when the encoded user data have been encoded with the predetermined number of memory cells to have the first logic state. When the number of activated memory cells matches the predetermined number, the memory controller 515 may stop applying the read voltage to the memory array and determine that all the activated memory cells of the encoded user data has the first logic state (e.g., the SET state of a PCM cell). Additionally, the memory controller 515 may determine that remaining memory cells of the encoded user data (e.g., the inactive memory cells when the number of activated memory cells matches the predetermined number) have the second logic state (e.g., the RESET state of a PCM cell).

Figure 6:
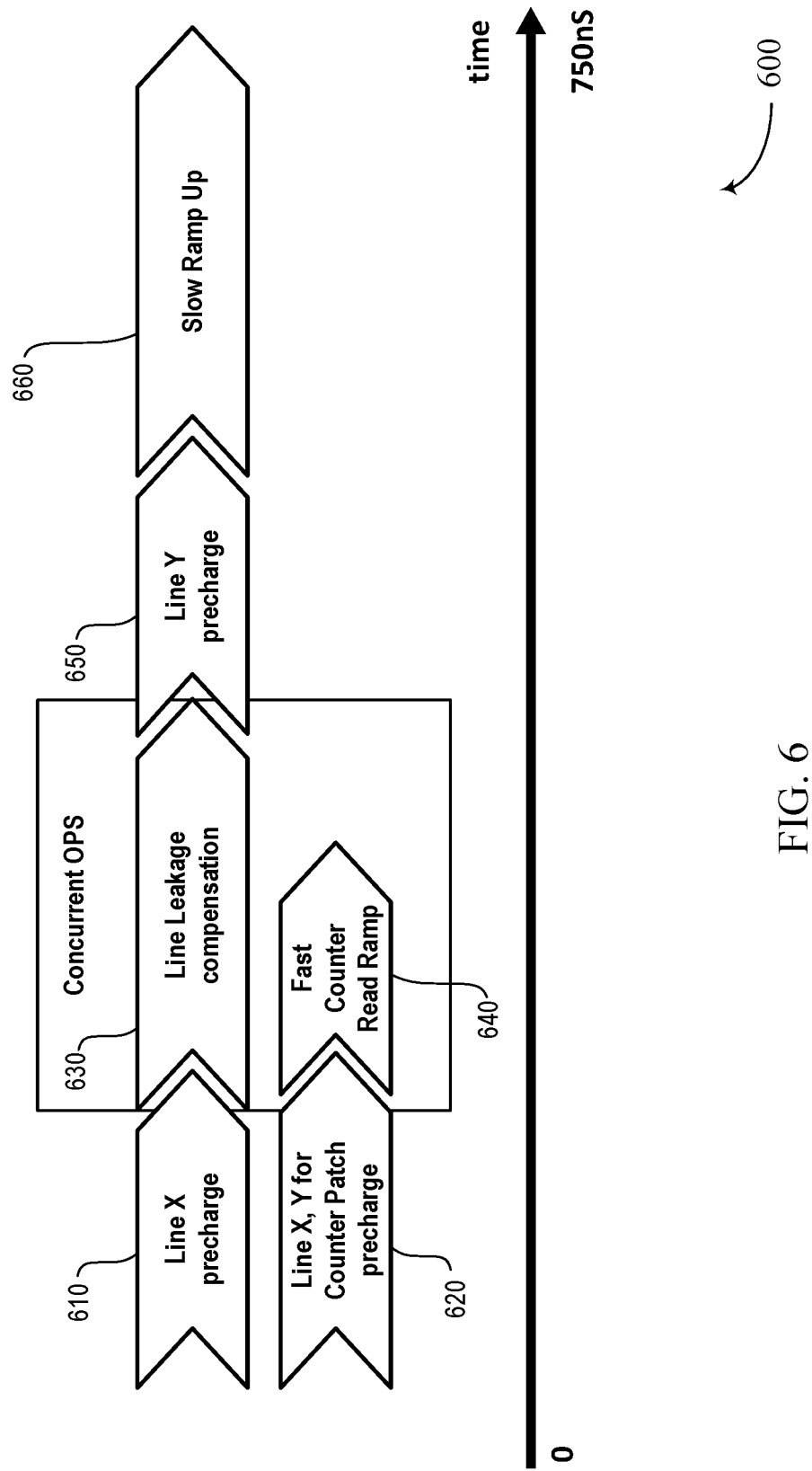
FIG. 6 shows a schematic view illustrating a reading algorithm operating according to the method of the present disclosure to implement a reading phase of a memory counter in parallel with the reading phase of a memory codeword.

Referring now to FIG. 6, it discloses a scheme 600 reporting a time schedule of the actions performed by a sensing algorithm and according to the disclosed method starting from an initial phase 610 wherein a line X pre-charge is performed typically of the 3DXP memory cells.

In parallel, a complete X and Y line pre-charge is performed on the patch of the counter portion 404. This pre-charge phase 620 is immediately followed by a reading phase 640 of the counter bits performed with a fast ramp of a biasing voltage.

At the same time, as may be appreciated by the time line of FIG. 6, the data bits of the codeword are submitted to a line leakage compensation phase 630. The compensation phase is necessary in this kind of memories to align the internal currents of the sensing circuitry with the leakage currents.

So, these actions would be performed in any case in a vertical cross point memory device and the time involved by this phase 630 is not extending the reading phase involved for reading the content of the counter portion.

A subsequent phase 650 is a line Y pre-charge of the memory cells followed by a slow ramp 660 growing of the biasing reading voltages applied on the data bits of the codeword.

The whole sensing and reading operations are completed in about 75 ns.

Figure 7:
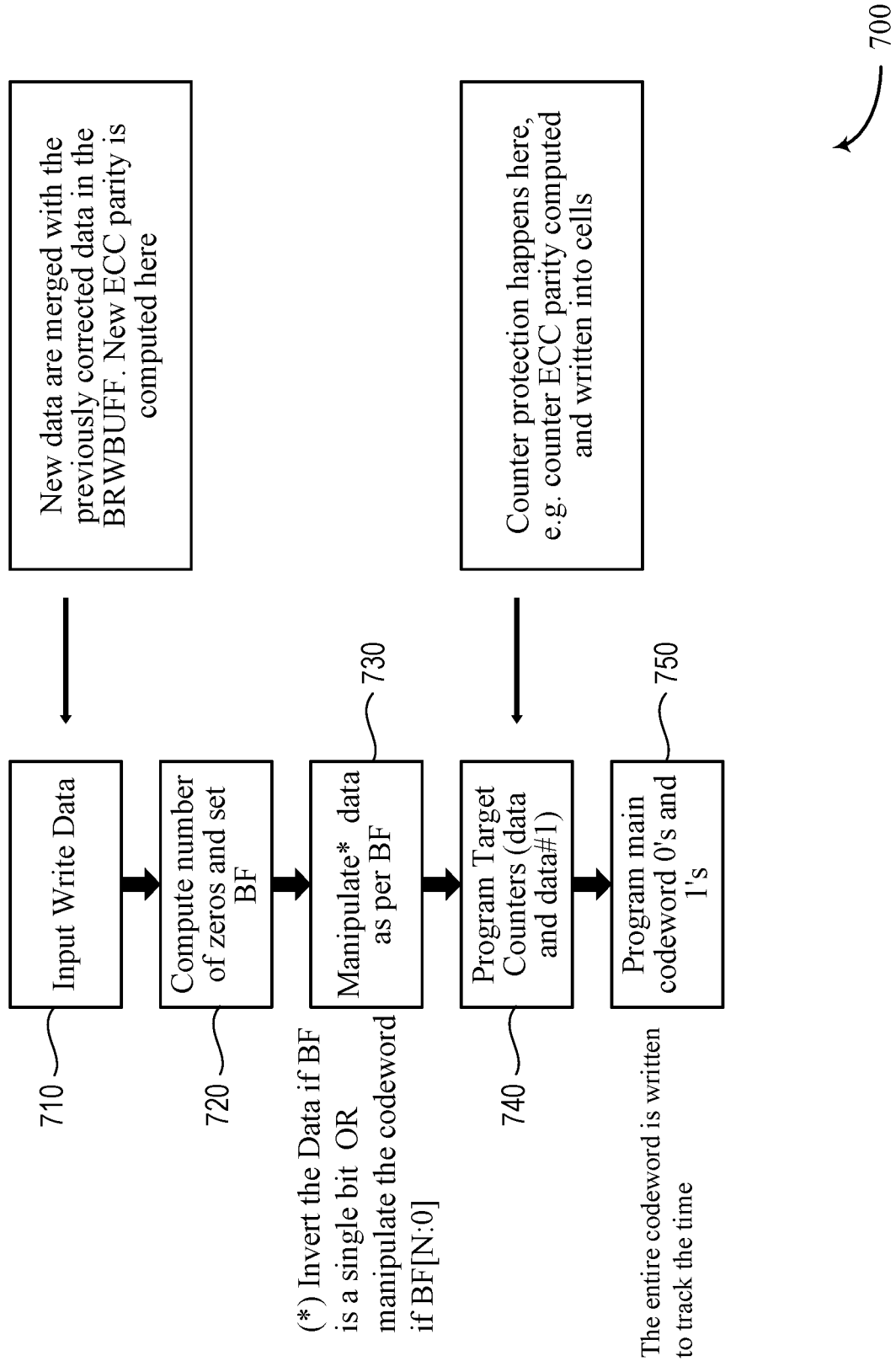
FIG. 7 shows a block diagram of the programming phase preparing the memory device of the present disclosure for operating according to the disclosed sensing method.

FIG. 7 shows a schematic flow chart reporting the sequence of actions that are performed during the sole programming phase for setting the codewords with the associated parity and ECC bits and with the counter reporting the value of the bits of the codeword having a same logic value.

The first input action is represented by the block 710 wherein the programming algorithm takes care of the input write data. The new data are merged with the previously corrected data in the buffer BankReadWriteBuffer (BRWBuff). The new ECC parity bit is computed in this phase.

The algorithm proceeds with the computation of the number of zeros setting the Bit Flip BF information in block 720.

Then, in block 730, the data are manipulated according to the BF value. If BF is a single bit (i.e. BF=1), the data is completely inverted; on the contrary, BF may include more bits if the data blocks to be written are divided in more codewords or portions. A different convention could be obviously adopted.

The algorithm proceeds in block 740 representing a phase wherein the program target counters are stored, with corresponding data and data #. The counter protection is implemented in this phase computing the counter ECC parity that is written into the cells.

A final programming phase is schematically shown in block 750 wherein the main codeword "0's" and "1's" are programmed. In other words, the entire codeword is written to track the time; since the various cells have a growing drift in time the writing of all the cells includes a resetting phase thus setting the same drift.

It should be noted that it would be advisable to guarantee an error probability that shall be lower that a predetermined threshold and measures should be taken respect such a target.

Figure 8:
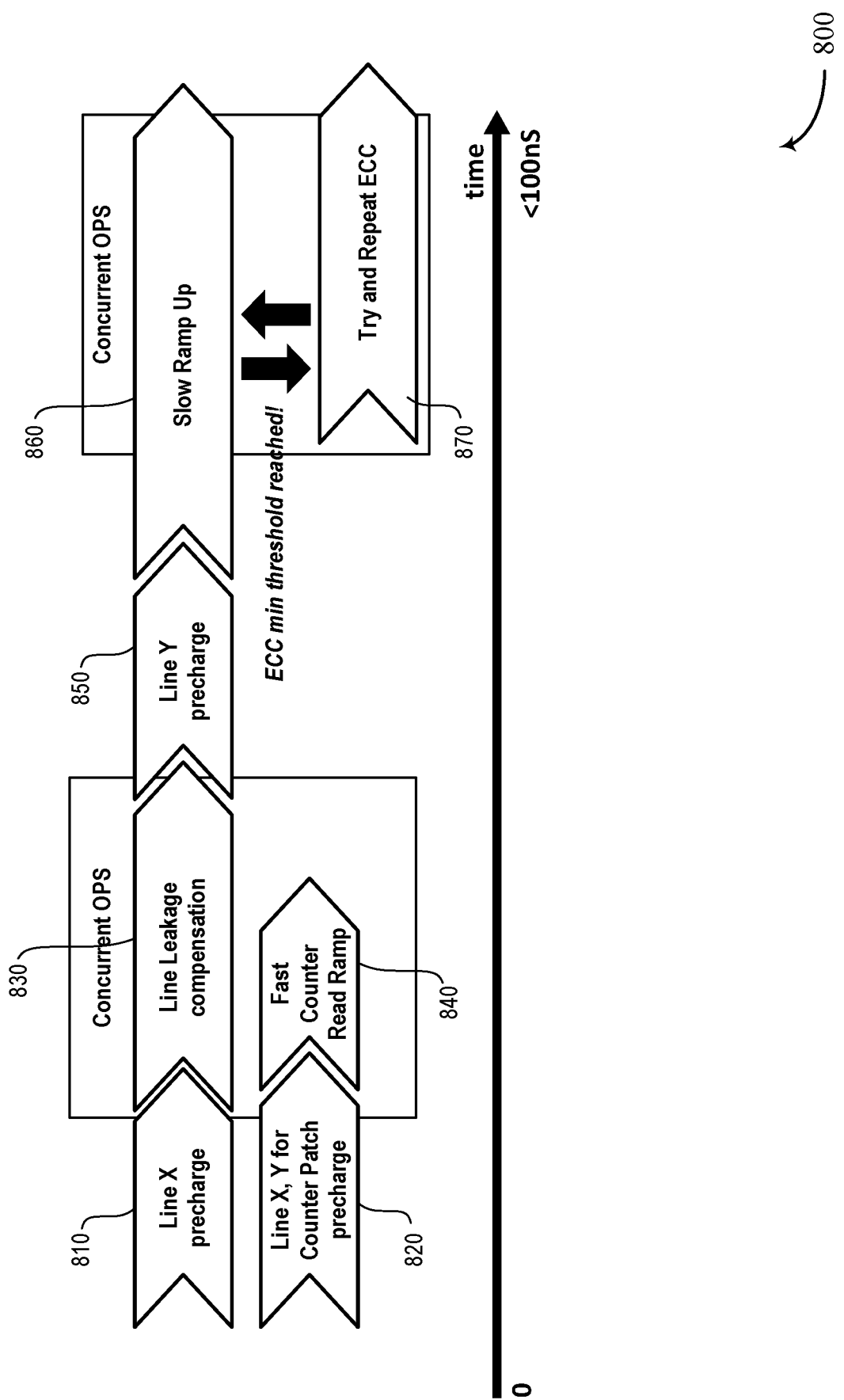
FIG. 8 shows a schematic view illustrating a reading algorithm operating according to the method of the present disclosure to implement a reading phase of a memory counter in parallel with the reading phase of a memory codeword and with a further final try and repeat sensing phase.

In this respect, making now reference to the schematic example of FIG. 8, it may be appreciated that the sensing algorithm may rely on ECC1 with a Try aNd Repeat phase shown in block 870.

FIG. 8 discloses a scheme 800 reporting a time schedule of the actions performed by a sensing algorithm and according to the disclosed method starting from an initial phase 810 wherein a line X pre-charge is performed typically of the 3DXP memory cells.

In parallel, a complete X and Y line pre-charge is performed on the patch of the counter portion 404. As already seen in the example of FIG. 6, this pre-charge phase 820 is immediately followed by a reading phase 840 of the counter bits performed with a fast ramp of a biasing voltage.

At the same time, as may be appreciated by the time line of FIG. 8, the data bits of the codeword are submitted to a line leakage compensation phase 830 for aligning the internal currents of the sensing circuitry with the leakage currents.

Since these actions would be performed in any case in a vertical cross point memory device and the time involved by this phase 830 is not extending the reading phase involved for reading the content of the counter portion.

A subsequent phase 850 is a line Y pre-charge of the memory cells followed by a slow ramp 860 growing or raising of the biasing reading voltages applied on the data bits of the codeword.

During the raising phase of this slow ramp for the biasing voltages it takes phase in parallel also the concurrent operation of the try and repeat shown in block 870.

The whole sensing and reading operations are completed in about 100 ns.

It must be noted that a single physical fail (of the logic value programmed in a memory cell) requires two logical bit correction. Therefore, the Try aNd Repeat (TnR) approach performed in phase 870 is useful to recover correctability power using the ECC1.

As a matter of fact, ECC1 must reliably detect more than two bits errors and just correct one bit.

We may suppose, just for example, to count N−1 bits and check for the ECC1 status. If there are no errors, the sensing is stopped. Later, if it is the case, the sensing is repeated by counting up two more steps; that is to say: counting up to N+1 bits. In other words, having a possible correction power ECC1 all the codeword with less than N−1 read logic values "1" cannot be corrected as well as those with more than N+1 read logic values "1". Therefore, all the range outside the interval [N−1, N+1] are not useful for a correction and there is no utility in reading beyond N+1 bits.

Now, since the ECC1 is capable to correct the last error, a couple of repair bits would be required for the TnR approach in all the other cases with a number of bits: N−2, N, N+2 with ECC2. In other words, if there is a need to correct two bits with ECC2, using an ECC2 algorithm having a greater detection power, it should be taken as useful the codewords presenting N−2, N or N+2 logic values "1". Therefore, an N−2 codeword must be verified, if it is not correct then the check will proceed up to a codewords of N bits or N+2 bits or to the first correct codeword. Once the N+2 bits are reached, the check must be stopped since the codewords having a number of logic values "1" greater than N+2 are not correct. The last one will be the correct one with the highest probability.

If should be finally noted that the Try aNd Repeat (TnR) sensing phase 870 with ECC1 may start in advance when a certain threshold of triggers is reached.

Figure 9:
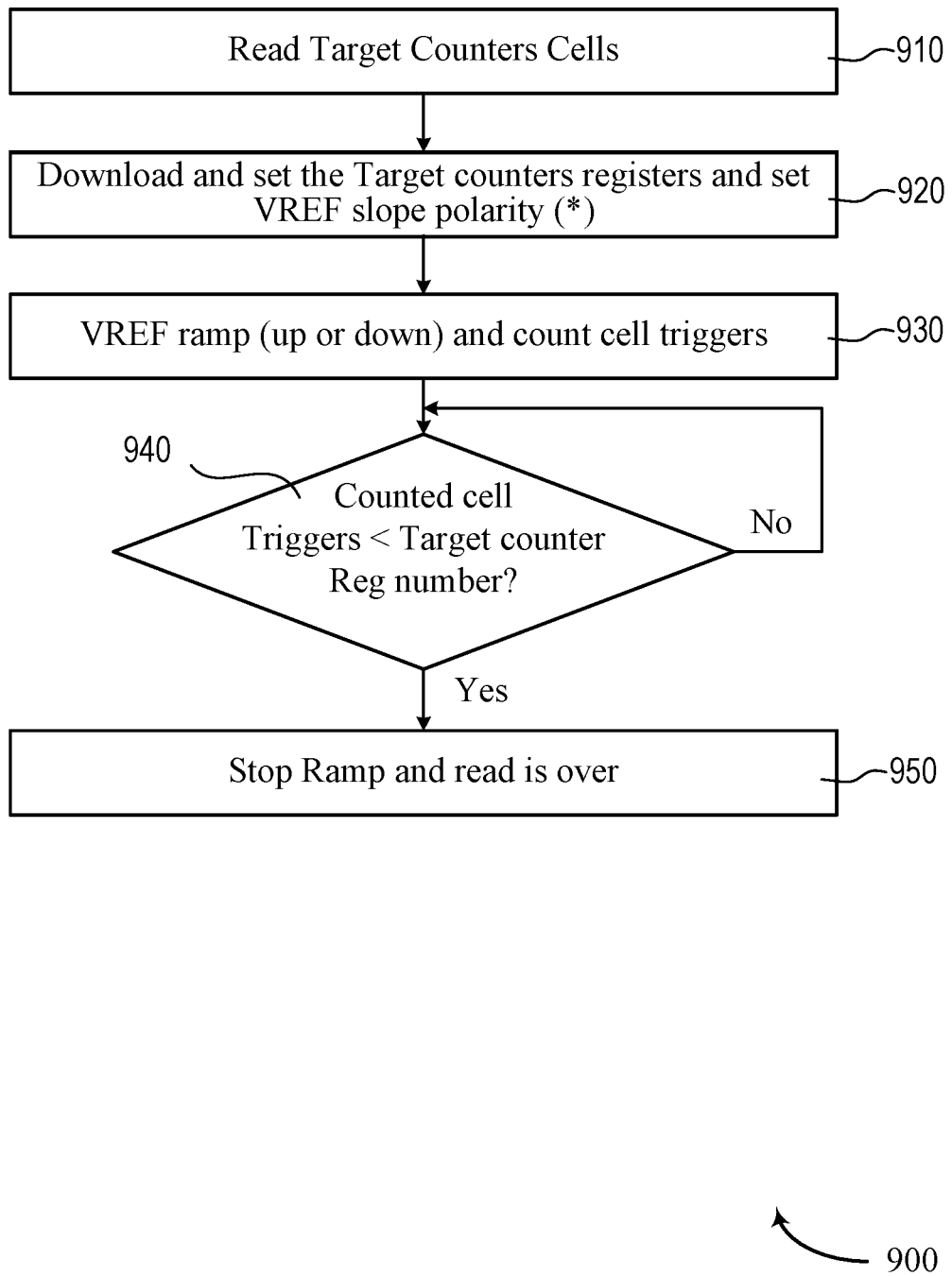
FIG. 9 illustrates a block diagram of a reading phase of the memory device performed according to the method of the present disclosure.

FIG. 9 shows a block diagram 900 illustrating a schematic view of the sensing and reading phases of the memory cells performed through an reading algorithm.

The first phase is illustrated by the block 910 wherein the cells of the pertinent counter register are read to get the value of the number of bits of the codeword having one of the two logic values, for instance the logic value "1".

In phase 920 the registers of the counters are downloaded and the value of the Vref for biasing the memory cells is set. The value of the biasing voltage Vref allows defining the slope of the raising ramp of the biasing voltage.

Now, according to the value of the Bit Flip cells the polarity of the ramp is regulated. For instance, if the logic value of the BF cells is zero, then the Vref slope is set to go up to down and the target counter register is equal to the target counter cells value. The slope polarity may depend by many factors, for instance if we need to read the logic values "0" or "1", if it is more convenient to use a reading cells direction or the opposite one. Therefore, in this phase the slope raising is set and could be even different in two different reading phases of the same device. On the contrary, if the logic value of the BF cells is one, then the Vref slope is set to go from down to up and the target counter register is not equal to the target counter cells value.

The block 930 illustrates that the Vref value, no matter if it is raising from up and down or viceversa, is used also to trigger the cells of the counters. Obviously, with different sensing the situation could be the opposite and having the same raising slope if BF=1 or viceversa.

Then, in the testing phase 940 it is compared if the number of the triggered memory cells is still minor of the value contained in the pertinent or corresponding counter. If the value downloaded from the counter has not yet been reached, the reading phase proceeds and the testing phase is repeated.

On the contrary, if that value has been reached the raising ramp is stopped and the reading phase is terminated.

Figure 10:
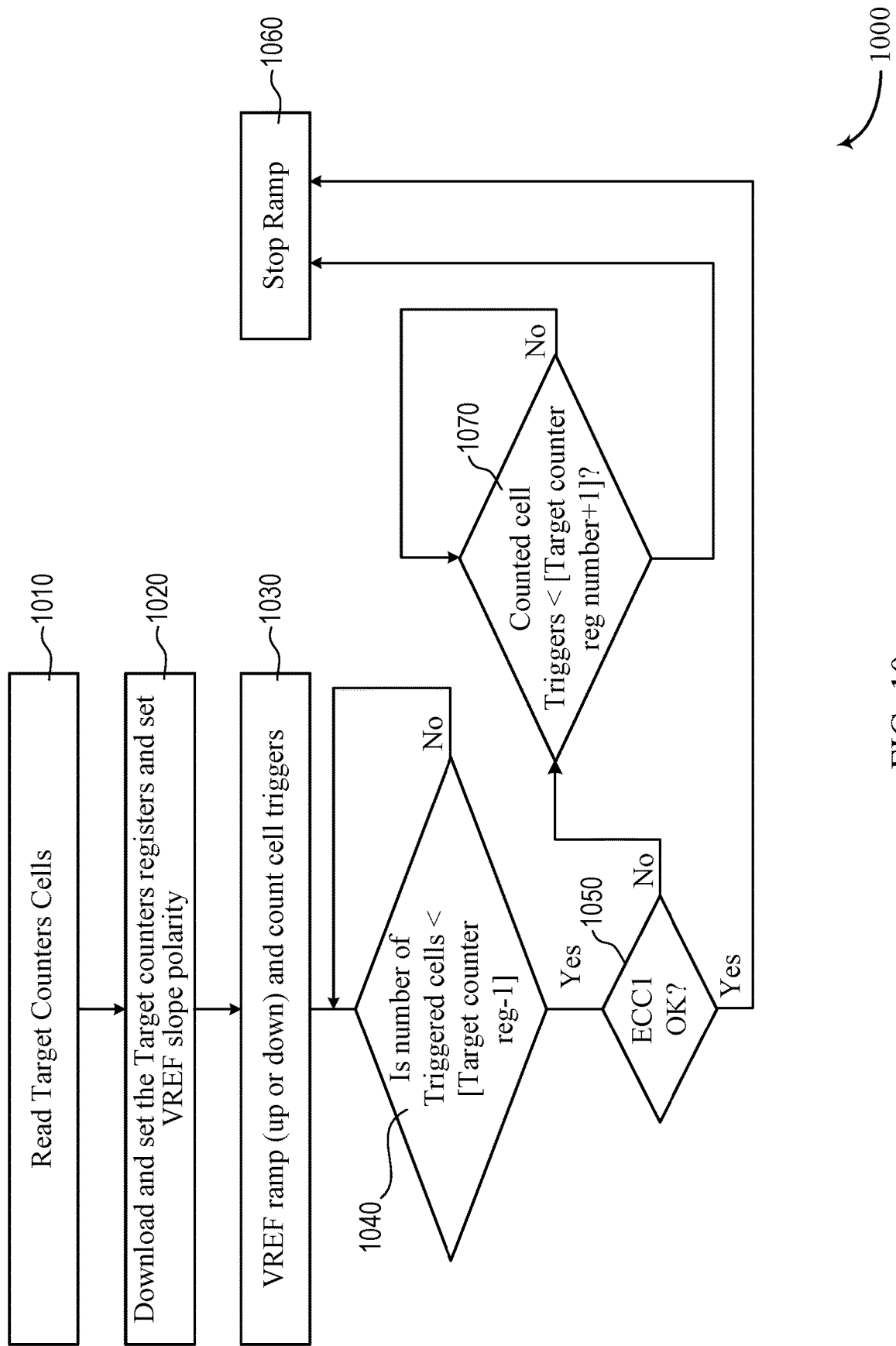
FIG. 10 illustrates a block diagram of an alternative reading phase of the memory device performed according to the method of the present disclosure and corresponding to the example of FIG. 8.

FIG. 10 shows a block diagram 1000 illustrating a schematic view of the sensing and reading phases of the memory cells performed through an alternative embodiment of reading algorithm still in line with the principle of the present disclosure.

The first phase is illustrated by the block 1010 wherein the cells of the pertinent counter register are read to get the value of the number of bits of the codeword having one of the two logic values, for instance the logic value "1".

In phase 1020 the registers of the counters are downloaded and the value of the Vref for biasing the memory cells is set. The value of the biasing voltage Vref allows defining the slope of the raising ramp of the biasing voltage.

As in the example of FIG. 9, according to the value of the Bit Flip cells the polarity of the ramp is regulated. For instance, if the logic value of the BF cells is zero, then the Vref slope is set to go up to down and the target counter register is equal to the target counter cells value. On the contrary, if the logic value of the BF cells is one, then the Vref slope is set to go from down to up and the target counter register is not equal to the target counter cells value.

The block 1030 illustrates that the Vref value, no matter is raising from up and down or viceversa, is used also to trigger the cells of the counters.

Then, in the testing phase 1040 it is compared if the number of the triggered memory cells is still minor of the value contained in the pertinent or corresponding counter minus 1 [N−1]. This value corresponds to the number N of the counter minus the ECC corrective power. If the value [N−1] downloaded from the counter has not yet been reached, the reading phase proceeds and the testing phase is repeated.

When this value [N−1] is reached a further test is performed in block 1050 to check if the ECC1 value is correct. If the answer is positive (yes), then the raising ramp is stopped and the reading phase is terminated in block 1060. This means that the memory cells are not stressed by a higher biasing voltage that is not useful for proceeding a reading phase that has already been completed.

On the contrary, if the answer is negative (no), then a possible error involving at least three bits might have occurred and the Try aNd Repeat (TNR) mechanism shown in FIG. 8 is activated. In this case a further test is performed in block 1070 wherein it is compared if the number of the triggered memory cells is still minor of the value contained in the pertinent or corresponding counter plus 1 [N+1]. However, this further and extended reading procedure has a low probability and may be activated only in seldom occasions.

The method disclosed herein has the great advantage to avoid the setting of a fixed biasing voltage value since the reading phase is performed using a raising voltage that in the largest part of the occasions is not raised up to the maximum value that can be touched without affecting the memory cells.

Figure 11:
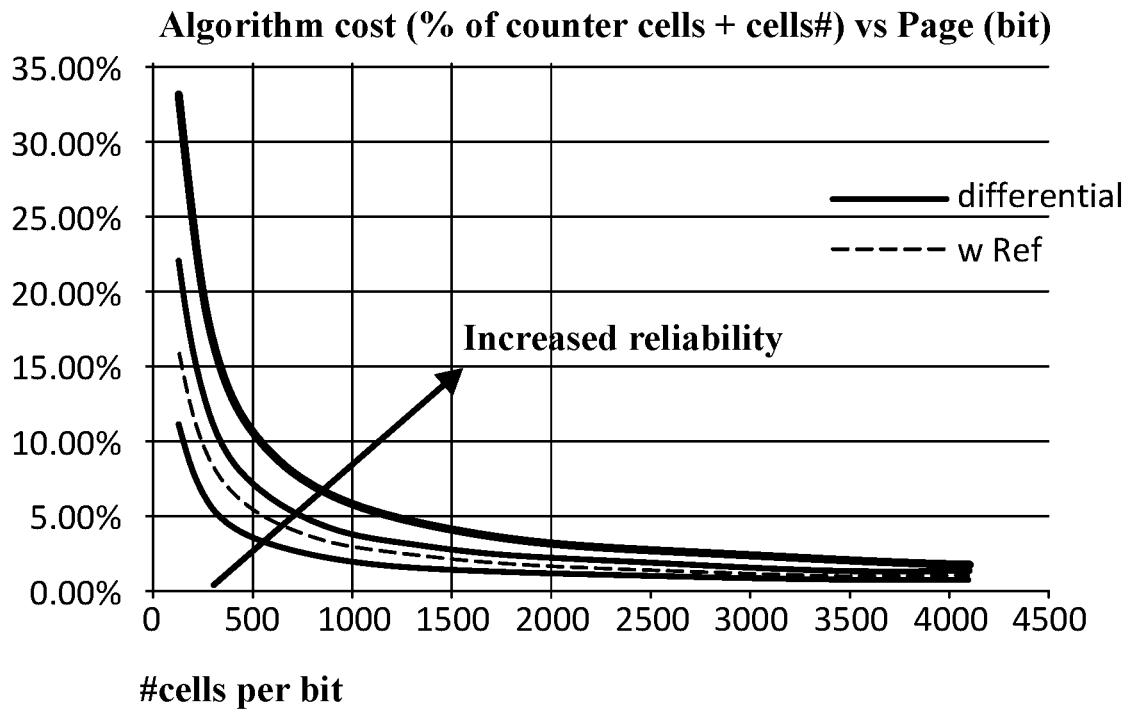
FIG. 11 is a diagram showing few curves indicating an increased reliability of the reading phase adopting the method of the present disclosure.

FIG. 11 is a diagram illustrating the small increment of the cost for manufacturing a memory device configured for hosting the counter cells associated to the corresponding codework. The horizontal axis relates to number of cells per memory page while the vertical axis indicated the percentage of the increased algorithm cost in consideration of the extra memory bits for different counters complexity.

The shown curves indicate that there is an increased reliability in the direction indicated by the central arrow. Of course, a compromise may be found in terms of configuration of fat cells (2X, 3X); differential fat cells, ECC1, differential ECC1, balanced codes and/wear leveling procedures.

Just as a possible numeric indication a page of 128 Byte would involve a modest increase of 2,48% of the whole manufacturing cost. This fact demonstrates that the proposed method and memory architecture is of a simple design and relatively little cost, in particular for a memory page of 128 Bytes with differential ECC1 protected cells.

Moreover, with the addition of N or more Bit Flip BF cells, then maximum number of zeros can be properly increased thus reducing the Bit Error Rate due to the switching distribution (Low Vth). Using for instance an increased number of Bit Flip cells it would be possible to reduce or to keep in a relatively low percentage the number of bits to be checked in a single codeword.

The method of the present disclosure offers a deterministic approach that does not depend on the distribution shape (gaussian vs non-gaussian) of the stored cells; moreover, working with ramped lower voltages in average the reset disturb may be managed more properly.

The reference voltage Vref may be set after the first and fast reading pulse focused on the counter portion; therefore, the reference voltage is set for each codeword.

Figure 12:
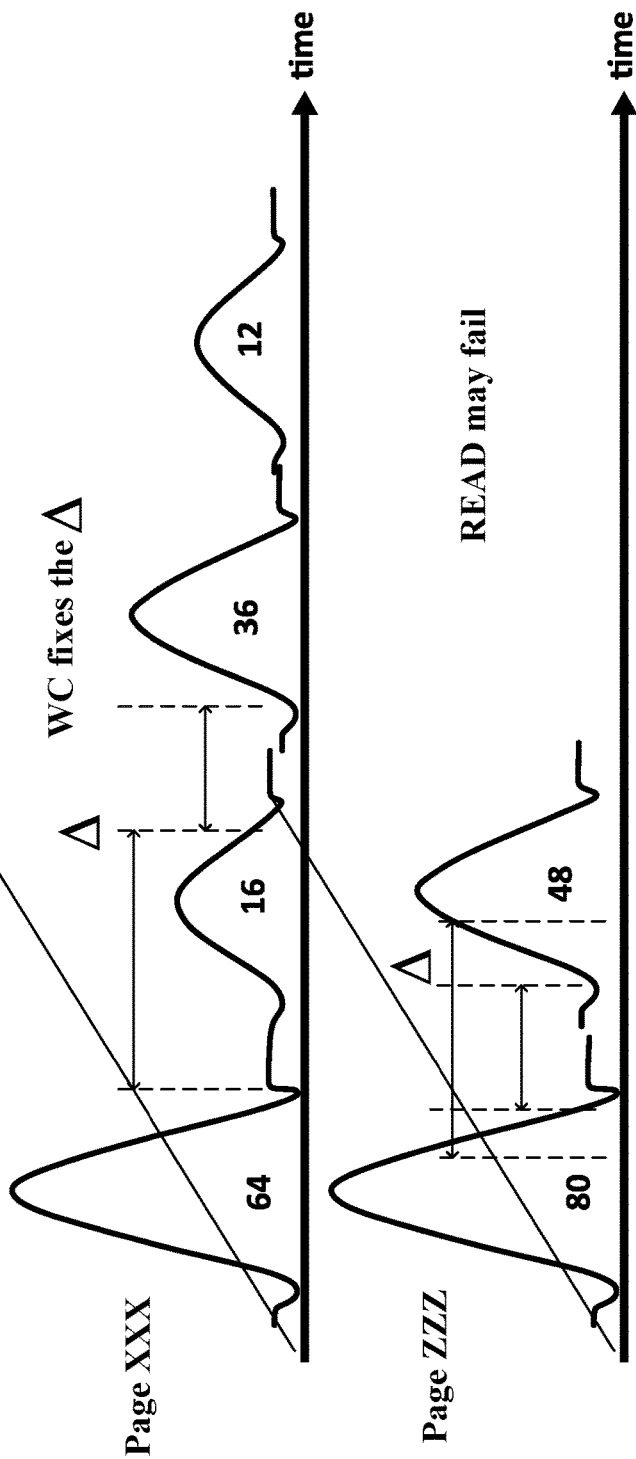
FIG. 12 shows a comparative diagram of the distribution vs. time of memory cells that may be detected during a reading phase in two different generic memory pages XXX and ZZZ according to known solutions.

Just to represent a comparison with known solutions FIG. 12 shows a comparative diagram of the distribution vs. time of the cells that may be detected during a reading phase in two different generic memory pages XXX and ZZZ including 128 bits and having a different sensibility to the biasing reading voltage.

In the upper diagram relating to a page XXX it is indicated a possible distribution 1210 of eighty (80) bits having the logic value "1" and remaining forty-eight (48) bits having the logic value "0".

In the embodiments of the present disclosure the memory cells exhibit electrical responses to a first voltage. For example, in one embodiment, the memory cells can either switch or not switch in response to predetermined raising voltage value.

In one embodiment, whether or not a given memory cell switches in response to said predetermined voltage value depends on, for example, whether the memory cell is programmed to a logic value 1 or to a logic value 0, and whether or not the memory cell exhibits threshold voltages in the range of overlap between the distributions.

In embodiment of the present disclosure a memory cell switches in response to an applied voltage if the applied voltage has a magnitude that is greater than the exhibited threshold voltage. Therefore, the plurality of memory cells can be grouped based on their response to said first voltage, including: memory cells that are programmed with a logic 1 that switch in response to the first voltage or memory cells that are programmed with a logic 0 that do not switch in response to the first voltage.

In FIG. 12 the slope 1250 is indicative of a voltage ramp raising during the reading phase while the extended distribution of the cells in the memory page XXX shows a time difference Δ that is fixed by the WC and is required for reading all the 80 cells having the logic value "1".

The lower diagram relates to another page ZZZ wherein the distribution of the cells having opposite logic values "1" and "0" is different. In such a case, the correct reading phase may fail since the time difference Δ would include also cells having a logic value "0".

Figure 13:
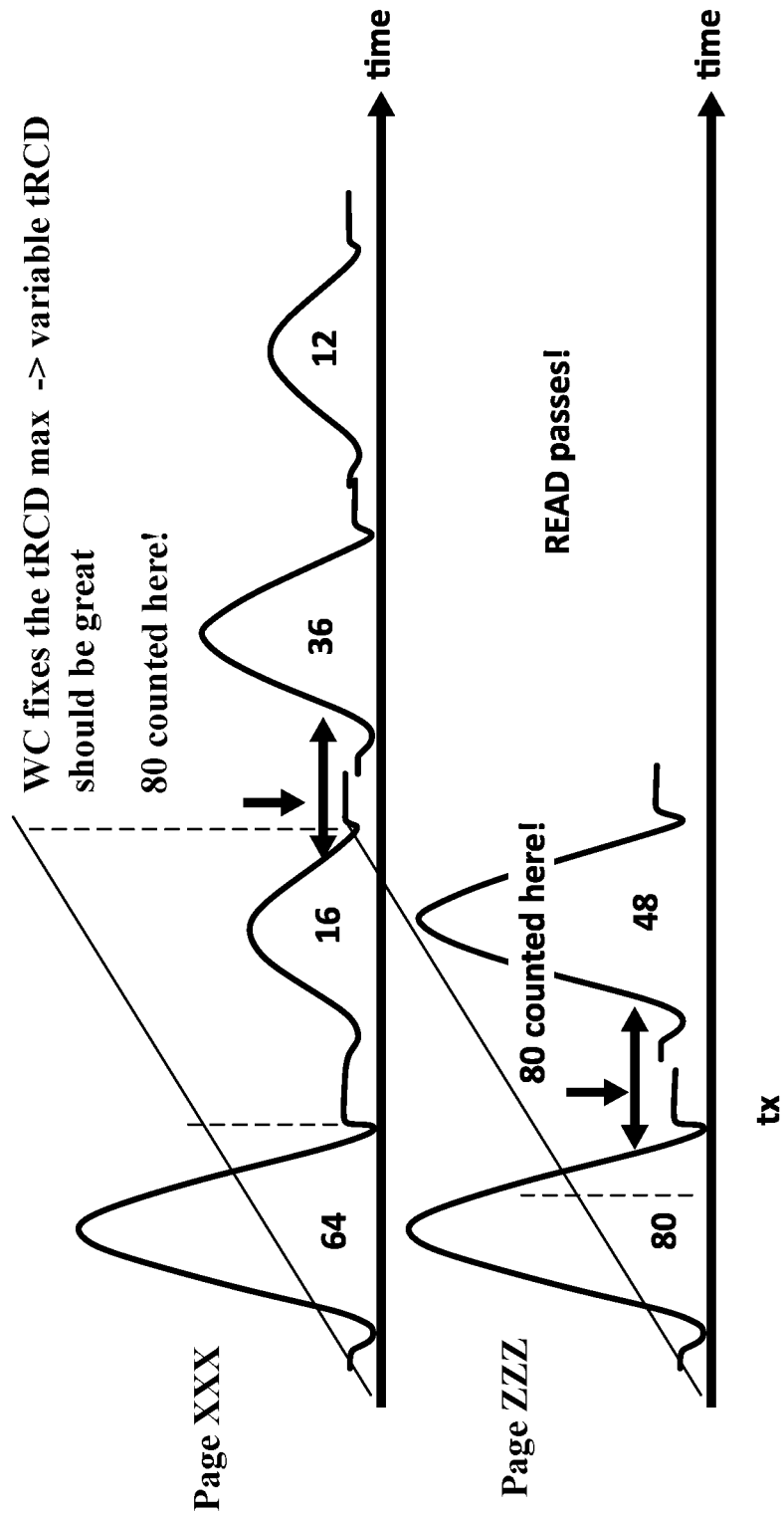
FIG. 13 shows a comparative diagram of the distribution vs. time of memory cells that may be detected during a reading phase in two different generic memory pages XXX and ZZZ according to embodiments of the present disclosure.

FIG. 13 shows a diagram similar to FIG. 12 comparing the reading phases performed on two different memory pages XXX and ZZZ having the same distribution shown in FIG. 12. The slope 1350 of the raising biasing voltage corresponds to the slope 1250 of the previous figure.

As shown in this FIG. 13, the WC fixes the maximum time $t_{RCD}$ that is required for completing the reading of a given codeword. In presence of an extended or longer distribution the number of eighty cells having the logic value "1" is completed at time t1.

On the contrary, with the distribution shown with respect to the memory page ZZZ, then the reading phase of the eighty cells having the logic value "1" is completed at time tx thus obtaining a correct reading phase in a shorter time frame since tx<t1.

Figure 14:
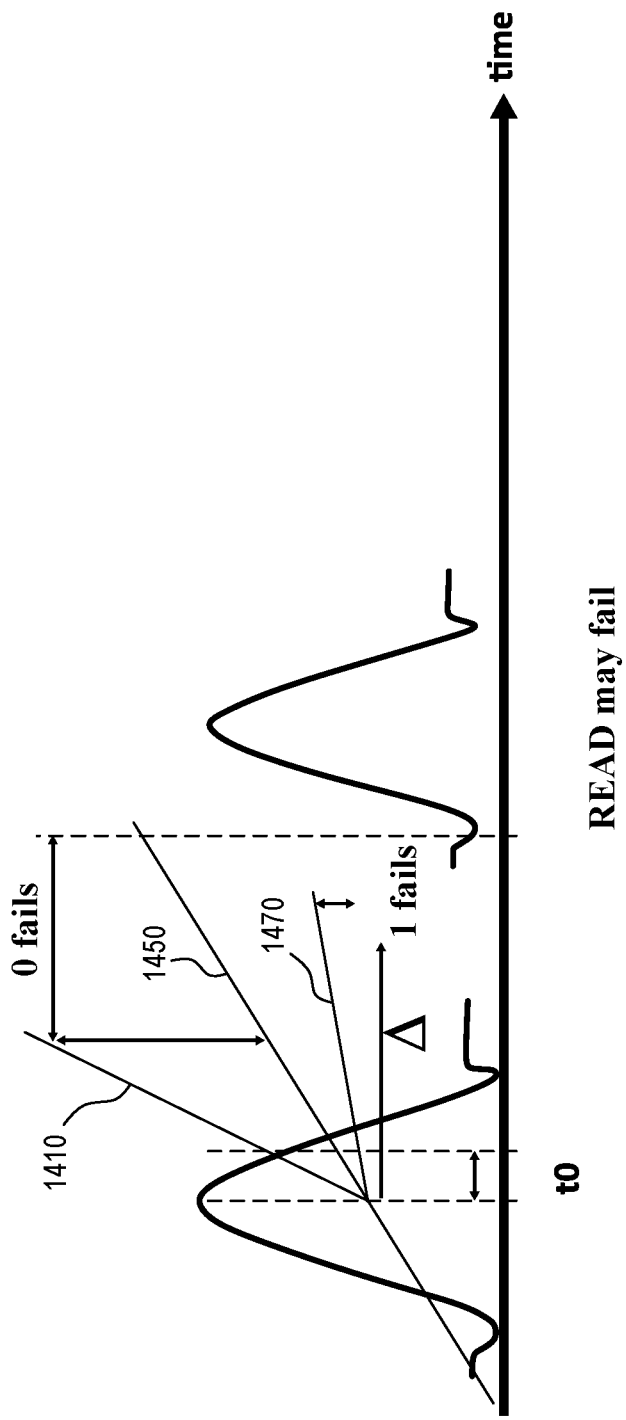
FIG. 14 shows a diagram of the distribution vs. time of memory cells that may be detected during a reading phase adopting a biasing reading voltage having a ramp with variable slope.

Making now reference to the example of FIG. 14, it may be appreciated that the use of a raising biasing voltage having different slope may have a modest impact on the successful reading according to the method of the present disclosure.

FIG. 14 shows a regular ramp 1450, corresponding to the ramp 1350 or 1250 of the previous FIGS. 12 and 13, has a predetermined regular slope. If we imagine that to modify this slope at time t0 for accelerating the raising of the ramp as reported by the sloping line 1410, we would obtain a correct reading result but we would stress too much the memory cell without obtaining an effective advantage.

On the contrary, if we should reduce the raising of the ramp as reported by the other sloping line 1470 we would obtain a single reading fail that would be compensated by the ECC correction. In this case, however, the electric stress on the memory cells would be modest while obtaining a satisfactory reading result increasing the cycling life of the memory device.

The possible failures in the reading phase are all outside the maximum time frame set by the selection of the reference voltage.

In case WC is affected by noise, only slowing down slew rates may have an impact on the reading phase while slowing up does not.

FIG. 14 may be considered as an indication that a possible uncertainty on the raising slope produces a fail in the system of FIG. 12 but not in the system of FIG. 13. If we have applied a fixed time difference Δ the reached voltage value Vref will be slope* Δ in the system of FIG. 12, that will change; on the contrary, in case of the counter of the present disclosure the voltage value Vref remains that used for the reading phase of the N cells containing the "1" logic value and presents a certain immunity to the slope uncertainty.

At the end we may briefly summarize few aspects of the memory structure and reading method of the present disclosure the first of which is the use of proper set of Bit Flip information (from 1 to N bits) per every codeword to encode manipulation of the written data up to the desired number of zeros (or ones).

Moreover, BF cells are protected by vertical 3D cross point cells voting scheme or by differential cells (BF/BF #) with ECC bit(s).

The storing algorithm is configured to analyze and manipulated the written pattern to store the number of zeros (or ones) into target counters.

Those counters are associated to the corresponding codewords and are also implemented by vertical 3D cross point memory cells.

It should be remarked that the target counters are implemented with vertical 3D cross point differential cells protected by with ECC bit(s) (two cells per bit).

As an alternative the target counters may be implemented by vertical 3D cross point cells based on voting schemes, that may be considered as a protection scheme including ECC bit(s).

The target counter cells are read with a ramped scheme from low to high cell voltage during the pre-charge phase of the associated data cells.

As an alternative, the target counter cells may be read with a fixed VDM scheme.

Even the data cells of the codeword are read a with ramped scheme from low to high cell voltage (detecting low Vth cells) using the previously read target counter information to stop the biasing voltage ramp on the data cells.

The last triggered cell "soft" information is stored into one additional latch per sense amplifier for later use in soft ECC techniques.

A more basic reading algorithm uses an ECC correction scheme when counting the N values of the codeword while an alternative reading algorithm is used to pre-trigger ECC1 with a Try and Repeat soft engine when counting N−1 values and count up to N+1 values if ECC1 was not capable to correct the N−1 step.

As an alternative, with a more robust correction scheme, a further reading algorithm may be used to pre-trigger ECC2 with a Try and Repeat soft engine when counting N−2, N and count up to N+2 if ECC2 was not capable to correct the N−2, N step.

Additional codeword information, like topology, last Vref, read parameters (start, stop, #of trials etc), write status, etc. may also been stored in the associated registers.

In some examples of the method and apparatus described above may further include processes, features, means, or instructions for determining, based at least in part on a set of values, a total number of memory cells having a first logic state. Some examples of the method and apparatus described above may further include processes, features, means, or instructions for updating the counter to a first count value.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

The invention claimed is:

1. A counter-based sense amplifier method for reading memory cells, comprising:
   storing in a counter associated to an array of memory cells a value of a number of bits having a predetermined logic value of data bits stored in said array;
   reading from said counter the value corresponding to the number of bits having said predetermined logic value;
   reading data stored in the array of memory cells by applying a ramp of biasing voltages;
   counting the number of bits having said predetermined logic value during a data reading phase; and stopping the data reading phase when the number of bits having said predetermined logic value is equal to the value stored in said counter.

2. The counter-based sense amplifier method of claim 1, wherein a storing phase includes a Bit Flip phase to obtain a number of bits having the predetermined logic value not less than 50% of the data bits.

3. The counter-based sense amplifier method of claim 2, wherein said Bit Flip phase is used to encode data reaching a 50-50% balanced pattern.

4. The counter-based sense amplifier method of claim 1, wherein a counter reading phase is performed with a fast biasing voltage ramp on said counter while starting a biasing pre-charge or line leakage compensation phase of a data bits portion of the array of memory cells.

5. The counter-based sense amplifier method of claim 1, wherein said array of memory cells includes at least a codeword comprising: data bits with associated parity bits and a counter with associated ECC bit(s).

6. The counter-based sense amplifier method of claim 5, wherein said codeword further includes a group of Bit Flip cells with corresponding ECC bit(s).

7. The counter-based sense amplifier method of claim 1, wherein anytime a cell of the data bits is triggered, then it is turned automatically off.

8. The counter-based sense amplifier method of claim 1, wherein anytime a cell of the data bits is triggered, at a same time it is decremented a counter including the value corresponding to a number of cells having said predetermined logic value.

9. The counter-based sense amplifier method of claim 1, wherein a counter reading phase and the data reading phase are performed with a voltage ramp having a same slope.

10. The counter-based sense amplifier method of claim 1, wherein a content of a last triggered cell is stored into one additional latch per sense amplifier for later use in soft ECC techniques.

11. The counter-based sense amplifier method of claim 1, wherein a concurrent operation of try and repeat ECC takes place during the data reading phase.

12. The counter-based sense amplifier method of claim 11, wherein a concurrent operation of try and repeat ECC2 during the data reading phase of N−2, N and N+2 cells of a codeword of said array of memory cells.

13. A method for reliable reading of memory cells in vertical 3D memory devices comprising:
storing in a counter associated to a codeword of memory cells a value of a number of bits of the codeword having a predetermined logic value;
reading a content of the counter before reading a content of the codeword;
starting a counter reading phase during a pre-charge phase of the codeword; and
stopping a codeword reading phase when the number of bits having said predetermined logic value corresponds to the content of the counter.

14. The method of claim 13, further comprising:
a Bit Flip phase to obtain a number of bits having the predetermined logic value not less than 50% of data.

15. The method of claim 14, wherein said Bit Flip phase is used to encode data reaching a 50-50% balanced pattern.

16. The method of claim 13, wherein reading the content of the counter is performed with a fast biasing voltage ramp while starting a biasing pre-charge or line leakage compensation phase of the codeword.

17. The method of claim 13, further comprising:
a comparison between a number of cells read from the codeword and having said predetermined logic value with the content read from the counter; and
a reiteration of the codeword reading phase up to a moment wherein said number of bits having said predetermined logic value corresponds to said content of the counter.

18. The method of claim 17, wherein the counter reading phase and the codeword reading phase are performed with a voltage ramp having a same slope.

19. The method of claim 13, wherein a concurrent operation of a try and repeat algorithm with ECC takes place during the counter reading phase and the codeword reading phase.

20. The method of claim 19, wherein a try and repeat algorithm with ECC1 may start based on a certain threshold of triggered cells is reached.

21. The method of claim 13, wherein no voltage reference Vref is required for the counter reading phase since a biasing voltage ramp is used and the counter reading phase is stopped once the content of the counter has been determined.

22. The method of claim 13, further comprising:
an ECC1 test after having read a number N−1 of codeword data cells.

23. A memory device including at least a memory array comprising one or more arrays of memory cells and a memory controller supporting a counter-based sense amplifier method for reading the memory cells, the memory cells including vertical three-dimensional (3D) cross point memory cells, the memory device comprising:
at least a codeword in said memory array including data bits with associated parity bits and a counter with associated ECC bit(s).

24. The memory device of claim 23, wherein said codeword further includes at least a group of Bit Flip cells with corresponding ECC bit(s).

25. The memory device of claim 24, wherein said group of Bit Flip cells are protected by 3D cross point cells voting scheme or by differential 3D cross point cells with ECC.

26. The memory device of claim 24, wherein said group of Bit Flip cells includes a number from 1 to N of cells computed on a basis of a length of the codeword.

27. The memory device of claim 23, wherein said counter is implemented with a same memory cells of a data bits portion of said codeword.

28. The memory device of claim 23, wherein a content of a last triggered cell is stored into one additional latch per sense amplifier for later use in soft ECC techniques.

29. The memory device of claim 23, wherein the memory controller is configured to perform a counter reading phase in parallel with a biasing pre-charge or line leakage compensation phase of the data bits.

30. A memory device including at least a memory array comprising one or more arrays of memory cells and a memory controller supporting a counter-based sense amplifier method for reading the memory cells, comprising:
a set of Bit Flip cells for every codeword of the memory array to encode manipulated stored data up to a desired number of bits in a logic value; and
a counter for each codeword to record a number corresponding to a number of bits of a respective codeword having a same logic value.

31. The memory device of claim 30 wherein said set of Bit Flip cells are protected by a 3D cross point cells voting scheme or by differential 3D cross point cells with ECC.

32. The memory device of claim 30 wherein the memory controller is configured to read a content of a respective counter and a content of a respective codeword with biasing voltage ramp having a same slope.

33. The memory device of claim 30 comprising an extended codeword including said set of Bit Flip cells, a counter protected by parity bits, data bits with corresponding parity bits and further codeword information.

* * * * *